United States Patent
Kishino et al.

(10) Patent No.: US 7,656,918 B2
(45) Date of Patent: Feb. 2, 2010

(54) SEMICONDUCTOR LASER

(75) Inventors: Katsumi Kishino, Tokyo (JP); Ichiro Nomura, Tokyo (JP); Tsunenori Asatsuma, Kanagawa (JP); Hitoshi Nakamura, Hachioji (JP)

(73) Assignees: Hitachi, Ltd., Tokyo (JP); Sophia School Corporation, Tokyo (JP); Sony Corporation, Tokyo (JP)

( * ) Notice: Subject to any disclaimer, the term of this patent is extended or adjusted under 35 U.S.C. 154(b) by 345 days.

(21) Appl. No.: 11/688,275

(22) Filed: Mar. 20, 2007

(65) Prior Publication Data

US 2007/0217459 A1    Sep. 20, 2007

(30) Foreign Application Priority Data

Mar. 20, 2006  (JP)  ............................. 2006-076275

(51) Int. Cl.
   *H01S 3/16*  (2006.01)
   *H01S 3/04*  (2006.01)
(52) U.S. Cl. .................................... 372/43.01; 372/41
(58) Field of Classification Search .................... 372/39, 372/41, 43.01, 45.012
   See application file for complete search history.

(56) References Cited

FOREIGN PATENT DOCUMENTS

| JP | 08-148765 | 6/1996 |
|----|-----------|--------|
| JP | 2586349 | 12/1996 |
| JP | P 2000-500288 A | 1/2000 |
| JP | 2004-095922 | 3/2004 |
| WO | WO-97-18592 | 5/1997 |

OTHER PUBLICATIONS

"Kato, E. et al," "Significant Progress in II-VI Blue-Green Laser Diode Lifetime." Electronics Letters, 5th Feb. 1998, vol. 34, No. 3, 2 pages.
"Waag, A. et al," "Novel Beryllium Containing II-VI Compounds: Basic Properties and Potential Applications." 1998 Elsevier Science B.V., Journal of Crystal Growth, pp. 1-10.
"Kishino, Katsumi et al," "Yellow-Green Emitters Based on Beryllium-Chalcogenides on InP Substrates," Phys. Stat Sol. (c) 1, No. 6, 1477-1486 (2004).
"Hayami et al," "Pretext of the $52^{ND}$ Meeting of Japan Society of Applied Physics," 31P Z-N6 (1 pg.), 2005.
"Nakai, Yuki et al," Aging Characteristics of II-VI Yellow Light Emitting Diodes With Beryllium Chalcogenide (BeZnSeTe) Active Layers on InP Substrates, Phys. Stat. Sol., (a), 201, 12 (2004) (pp. 2708-2711).

*Primary Examiner*—Armando Rodriguez
(74) *Attorney, Agent, or Firm*—Antonelli, Terry, Stout & Kraus, LLP.

(57) ABSTRACT

A semiconductor laser having an n-cladding layer, an optical guide layer, an active layer, an optical guide layer, and a p-cladding layer above an InP substrate, in which the active layer has a layer constituted with Be-containing group II-VI compound semiconductor mixed crystals, and at least one of layers of the n-cladding layer, the optical guide layer, and the p-cladding layer has a layer constituted with elements identical with those of the Be-containing group II-VI compound semiconductor mixed crystals of the active layer, and the layer is constituted with a superlattice structure comprising, as a well layer, mixed crystals of a Be compositions with the fluctuation of the composition being within ±30% compared with the Be composition of the group II-VI compound semiconductor mixed crystals of the active layer, whereby the device characteristics of the semiconductor laser comprising the Be-containing group II-VI compound semiconductor matched with the InP substrate.

5 Claims, 13 Drawing Sheets

- 76 Al/Ti
- 75 MgSe/ZnSeTe/BeZnSeTe : N SL
- 74 ZnCdSe
- 73 InGaAs BUF.
- 72 InP BUFFER
- 71 InP SUB.

MgSe  ZnSeTe  BeZnSeTe

SUBBAND

SUBBAND

SEMICONDUCTOR LASER

CLAIM OF PRIORITY

The present application claims priority from Japanese application JP 2006-76275 filed on Mar. 20, 2006, the content of which is hereby incorporated by reference into this application.

BACKGROUND OF THE INVENTION

1. Field of the Invention

The present invention relates to a semiconductor laser that oscillates at a wavelength in a visible region of green color and yellow color and that is applied to displays, etc. More specifically the invention relates to a semiconductor laser designed in a stacked structure for improving operation characteristics of a semiconductor laser using a compound semiconductor comprising a group II element and a group VI element formed on an InP substrate.

2. Description of the Related Art

A semiconductor device emitting light in visible to ultraviolet regions, that is, a semiconductor laser or a light emitting diode is one of important semiconductor devices in the current society/industrial field, for example, in the applications to optical information recording apparatuses (compact disk(CD), digital versatile disc(DVD), Blu-ray Disc(BD)), light sources for color displays, semiconductor laser excitation, fabrication, sensors, measuring apparatuses, medical use, or white lamps. The outline of the wavelength and semiconductor materials of optical devices is as shown in Table 1.

TABLE 1

| Blue-light device | Semiconductor device emitting light from yellow to green | Red-light device | Infrared-light device |
|---|---|---|---|
| 400 nm band (particularly 400 to 480 nm) | 500 nm band | 600 nm band (particularly 635 to 670 nm) | 780 nm, 808 nm, 860 nm, 915 nm, 980 nm band |
| Group III-V nitride compound semiconductor comprising AlGaInN | No appropriate compound semiconductor capable of continuous-wave oscillation | Group III-V compound semiconductor comprising AlGaInP | Group III-V compound comprising AlGa(In)As |

As can be seen from Table 1, for semiconductor devices that emit light from yellow to green colors in a 500 nm band which is a wavelength band between red and blue colors, even development for materials has not yet been conducted, not to mention the research and development thereof. Accordingly, performance capable of coping with practical use has not yet been attained for semiconductor devices using the wavelength band described above, particularly, semiconductor lasers.

As the semiconductor for optical devices, group II-VI semiconductors are useful along with group III-V compound semiconductors. However, no green-yellow light semiconductor lasers have yet been put to practical use. The reason is mainly attributable to the fact that no sufficient reliability is obtainable. One of the causes for inducing deterioration of devices is multiplication of crystal defects which are micro defects in active layer portions of the laser.

Kato, et al. have made an effort to decrease defects of a stacked layer of ZnSe series materials formed on a GaAs substrate by devising crystal growth conditions, experimentally manufactured a laser having no defects in the active layer region and observed a device life up to 400 hours (Non-Patent Document 1: E. Kato, et al., Electron. Lett. 34, 282 (1998)). It has been pointed out that the life was restricted by movement of micro defects due to compressive strains and micro defects such as nitrogen doping in a P-type cladding layer.

In recent years, studies have been started for group II-V compound semiconductor materials containing beryllium for the group II element as the constituent material of green-yellow semiconductor lasers (Patent Document 1: JP No. 2586349, Patent Document 2: JW-A No. 2000-500288, Patent Document 3: JP-A No. 2004-95922, Non-Patent Document 2: A. Waag et al., Journal of Crystal Growth 184/185(1998)1-10). The present inventors experimentally manufactured BeZnSeTe series LED (Light Emitting Diode) using group II-VI compound semiconductor materials containing beryllium and confirmed a device life of 5000 hours, at room temperature, with an emission wavelength of 570 nm, with an injection current density of 130 A/cm$^2$ (Non-Patent Document 3: Kishino et al., Phys. Stat. Sol., 6, (2004) 1477-1486, Non-Patent Document 4: Hayami, et al., Pretext of the 52th Meeting of Japan Society of Applied Physics, 31p Z-N6, Non-Patent Document 5: Yuki Nakai et al., Phys. Stat. Sol. (a), 201, 12 (2004) pp. 2708 to 2711). The result is considered to provide a progress of the practical use of green-yellow semiconductor lasers.

It is considered that the improvement for the reliability in this system is attributable to the fact that lattice-matched crystal layer can be used by the use of an InP substrate and to the effect of suppressing degradation due to crystal defects and dislocations since the crystal becomes strong due to the introduction of beryllium (Be). Further, a semiconductor laser with a material configuration similar to that of the LED described above was experimentally manufactured and laser oscillation obtained by pulse driving at 77K was confirmed (Non-Patent Document 3). However, a continuous-wave room temperature oscillation required for practical use could not be attained in this structure.

While the BeZnSeTe series semiconductor laser manufactured on the InP substrate has a possibility of greatly improving the reliability compared with existent group II-VI lasers, it has not yet attained continuous-wave room temperature oscillation as the basic characteristic. The present invention intends to solve the problem described above and provide a laser structure capable of attaining high reliability and continuous-wave room temperature laser oscillation necessary for practical use. It also intends to provide a laser structure with easy crystal growth and improvement of yield in view of manufacture of the device. At first, problems in the conventional art described above are shown.

FIGS. 1A and 1B show the structure of a BeZnSeTe series LED prepared on an InP substrate as the conventional art (Kishino et al., Phys. Stat. Sol., 6, (2004) 1477 to 1486, Hayami, et al., Pretext of the 52th meeting of the Japan Society of Applied Physics, 31p-Z-N6, or Yuki Nakai, et al,, Phys. Stat. Sol. (a). 201, 12(2004) pp. 2708 to 2711). FIG. 1A shows a layer structure and FIG. 1B shows a band line-up schematically. The symbols, C. B. and V. B. respectively show a conduction band and a valance electron band. Bold solid lines in FIG. 1B show mini-bands formed in the superlattice. Reference numeral 1 denotes an n-electrode comprising Au and Ge; 2, an InP substrate; 3, an InGaAs buffer layer; 4, a Cl-doped ZnCdSe buffer layer; 5, a lower cladding layer comprising a Cl-doped MgSe/ZnCdSe superlattice; 6, a thick stepped superlattice layer comprising MgSe/ZnCdSe superlattice; 7, a BeZnSeTe active layer; 8, a MgSe/ZnCdSe superlattice layer; 9, an upper cladding layer comprising N-coped MgSe/BeZnTe superlattice; 10, an N-doped BeZnTe/ZnTe superlattice layer; 11, an N-doped ZnTe cap layer; 12, a p-electrode comprising Au; and 13, an insulative layer.

That is, the structure shown in FIGS. 1A and 1B has, as a basic structure, a three layered structure, in which an MgSe/$Zn_{0.48}Cd_{0.52}Se$ (2 ML (monolayer: molecular layer/4ML) n-cladding layer 5 (800 nm thickness) and an MgSe/$Be_{0.48}Zn_{0.52}Te$ (4 ML/6 ML) p-cladding layer 9 (500 nm thickness) are arranged with the $Be_xZn_{1-x}Se_yTe_{1-y}$ active layer 7 (7.5 nm thickness) as the center. The energy at the conduction band (C.B) edge of the n-cladding layer is lower than that at the conduction band edge of the active layer 7, and both of them are in a so-called type II junction.

Accordingly, in the case of directly connecting the n-cladding layer 5 and the active layer 7, electrons can not be injected sufficiently into the active layer. Accordingly, an MgSe/$Zn_{0.48}Cd_{0.52}Se$ (2 ML/3 ML, 15 nm thickness+2 ML/1 ML, 15 nm thickness) superlattice layer 6 (30 nm thickness), which is obtained by changing the thickness of $Zn_{0.48}Cd_{0.52}Se$ in a stepwise manner, is disposed between the n-cladding layer 5 and the active layer 7. Further, an MgSe/$Zn_{0.48}Cd_{0.52}Se$ (2 ML/1 ML) superlattice layer 8 (5 nm thickness) was disposed between the active layer 7 and the p-cladding layer 9. This is for preventing the degradation of the active layer during interruption of the growth in the crystal growth step. The n-$In_{0.48}Ga_{0.52}As$ buffer layer 3 (200 nm thickness) and the n-$Zn_{0.48}Cd_{0.52}Se$ buffer layer 4 (200 nm thickness) were disposed just above the InP substrate 2, and the MgSe/$Be_{0.48}Zn_{0.52}Te$ superlattice layer (50 nm thickness) and the ZnTe cap layer 10 (5 nm thickness) were disposed above the p-cladding layer 9. They were substantially lattice matched with the InP substrate 2 except for the ZnTe cap layer 10.

It was investigated for the cause that the continuous-wave oscillation at room temperature could not be attained in the laser structure, although the LED operation for the long time of 5000 hrs was confirmed in the structure shown in FIGS. 1A and 1B. A sample in which the composition of the active layer 7 was changed in a range of: 0.08<X<0.19 (0.16<Y<0.32) was manufactured, and photoluminescence and photo-current measurement was conducted. As a result, it was found that type II light emission at the boundary between the active layer 7 and the n-side stepped superlattice layer 6, that is, light emission between the spatially separated conduction band and the valence electron band of the hetero junction portion was caused, which lowered the light emission efficiency in the active layer 7. To prevent the type II light emission, the thick stepped superlattice layer 6 was introduced. However, the effect was not yet sufficient and the type II light emission was remarkable at the beryllium composition of 0.08 or more. Further, from the optical guide wave calculation, it was found that the optical confinement factor to the active layer 7 is as less as about 2%, which results in increase of the threshold value in the laser oscillation. Details for the result of calculation are to be described below.

SUMMARY OF THE INVENTION

From the analysis described above, to attain the higher reliability and continuous-wave room temperature oscillation directed to the practical use of a green and yellow semiconductor laser, the present invention proposes a constitution of a green-yellow semiconductor laser on the following basic guidelines.

(1) To attain high reliability, a basic structure of a semiconductor laser is constituted with a II-VI semiconductor containing Be, which is disposed on and lattice matched with an InP substrate.

(2) To increase the efficiency of injecting carriers to the active layer, an active layer, an optical guide layer, and a cladding layer are constituted with a double-hetero structure having a type I band line-up.

(3) An active layer, an optical guide layer, and a cladding layer capable of enhancing the optical confinement to the active layer are constituted.

Further, to attain the structure described above, the invention constitutes (4) the active layer, the optical guide layer, and the cladding layer are formed with the crystal materials and the layer structure, which can be manufactured with ease and high crystal quality and are stable. Also, it intends to provide a crystal growth technique capable of improving the crystal quality of the active layer, the optical guide layer, and the cladding layer.

Specifically, the active layer is put between the optical guide layers, and crystals of an identical Be-containing composition with that of the active layer are used for the well layer of the superlattice constituting the optical guide layer. Further, the guidelines (1) to (3) are attained by applying the Be-containing superlattice using 1-5 ML of thin film barrier layer for the optical guide layer. Further, the type I band line-up is attained conveniently by applying crystals of a Be-containing composition identical with that of the active layer not only for the optical guide layer but also for the cladding layer.

Further, the guideline (4) is attained by constituting the superlattice of the optical guide layer and the cladding layer with the Be-based II-VI having the same composition as that for the active layer as the constituent element, restricting the lattice mismatching degree with the InP substrate to 1% or less and combining a steep boundary due to Zn irradiation.

By the proposal described above, it is possible to provide a laser structure capable of continuous-wave oscillation at room temperature while keeping high reliability, and the proposed structural crystals can be manufactured easily at high quality.

According to the invention, a semiconductor laser emitting light from yellow color to green color having higher practical utility than usual can be manufactured.

DETAILED DESCRIPTION OF THE PREFERRED EMBODIMENTS

At first, the outline for the principle of the present invention is to be described.

Figure 2A:
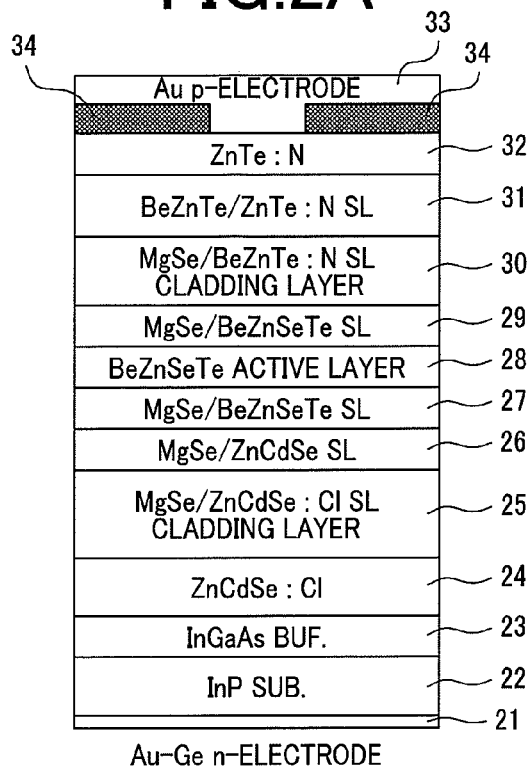
FIG. 2A is a schematic cross sectional view of a semiconductor laser according to the present invention.
Figure 2B:
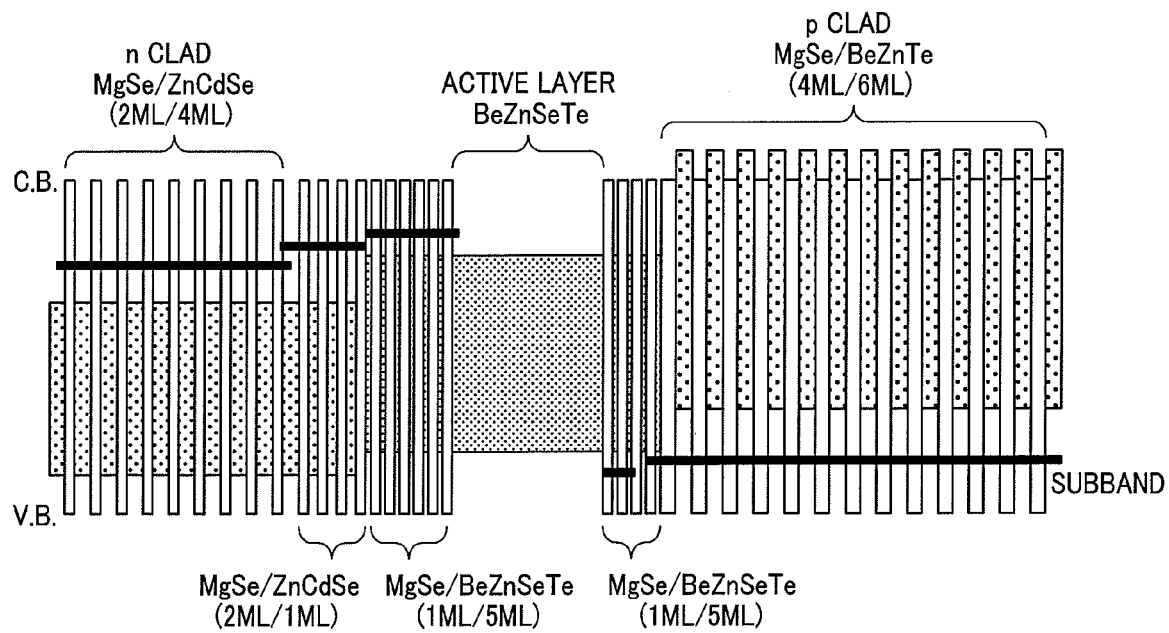
FIG. 2B is a view showing a band line-up of the semiconductor laser.

FIG. 2A shows a device structure of one example of the invention and FIG. 2B shows a band line-up. Bold solid lines in FIG. 2B show mini-bands formed in the inside of a superlattice. In FIGS. 2A and 2B, reference numeral 21 denotes an n-electrode comprising Au—Ge; 22, an InP substrate; 23, an InGaAs buffer layer; 24, a Cl-doped ZnCdSe buffer layer; 25, a lower cladding layer comprising a Cl-doped MgSe/ZnCdSe superlattice; 26, an MgSe/ZnCdSe superlattice layer; 27, an n-side optical guide comprising an MgSe/BeZnSeTe superlattice layer; 28, a BeZnSeTe active layer 28; 29, a p-side optical guide comprising an MgSe/BeZnSeTe superlattice layer; 30, an upper cladding layer comprising N-doped MgSe/BeZnTe superlattice; 31, an N-doped BeZnTe/ZnTe superlattice layer; 32, an N-doped ZnTe cap layer; 33, a p-electrode comprising Au; and 34, an insulative layer.

Figure 1A:
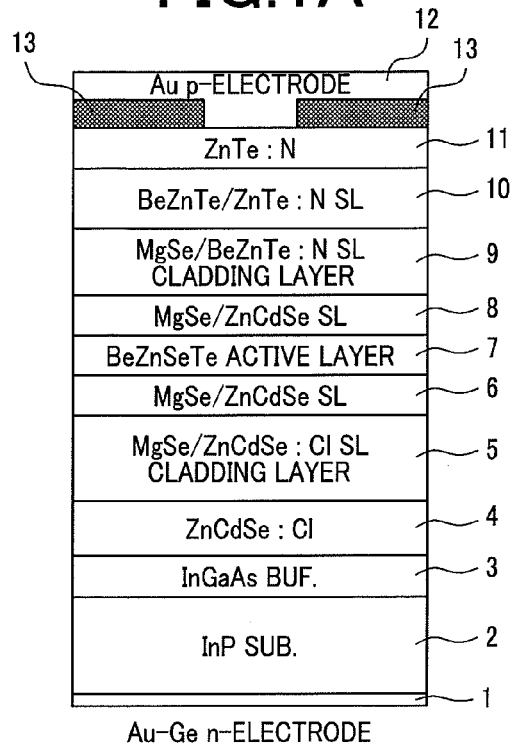
FIG. 1A is a schematic cross sectional view of a BeZnSeTe series light emitting diode or a semiconductor laser prepared on an InP substrate of an existent structure.
Figure 1B:
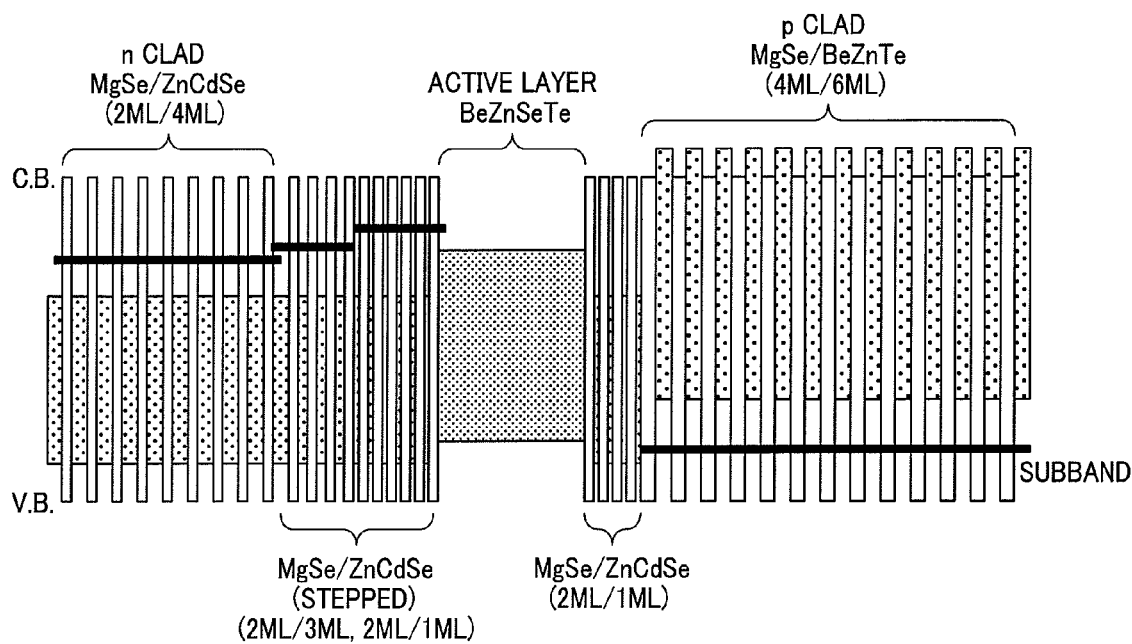
FIG. 1B is a view showing a band line-up of the light emitting diode or the semiconductor laser.

The structure shown in FIGS. 2A and 2B is identical with the structure in FIGS. 1A and 1B in that it has a three-layered structure as a basic structure in which an MgSe/$Zn_{0.48}Cd_{0.52}Se$ (2 ML/4 ML) n-cladding layer 25 (800 nm thickness) and an MgSe/$Be_{0.48}Zn_{0.52}Te$ (4ML/6ML) p-cladding layer 9 (500 nm thickness) are disposed with the $Be_xZn_{1-x}Se_yTe_{1-y}$ active layer 28 (7.5 nm thickness) as the center. However, the MgSe/$Be_{0.13}Zn_{0.87}Se_{0.38}Te_{0.62}$ (1 ML/5 ML) n-side optical guide layer 27 (100 nm thickness) is disposed just below the active layer 28 and the MgSe/$Zn_{0.48}Cd_{0.52}Se$(2 ML/1 ML) superlattice layer 26 (50 nm thickness) is disposed under the n-side optical guide layer 27. Further, the MgSe/$Be_{0.13}Zn_{0.87}Se_{0.38}Te_{0.62}$ (1 ML/5 ML) p-side optical guide layer 29 (50 nm thickness) is disposed just above the active layer 28.

That is, when compared with the structure shown in FIGS. 1A and 1B, the structure shown in FIGS. 2A and 2B of the invention is different in that the MgSe/ZnCdSe layer 8 just above the p-side of the active layer 28 (FIGS. 1A, 1B) is removed and the MgSe/BeZnSeTe superlattice n-side optical guide 27 and the p-side optical guide 29 are added. The invention has a feature in that the active layer 28 is put between the optical guide layers 27 and 29, and crystals of an identical composition with the Be-containing active layer 28 are used for the superlattice well layers constituting the optical guide layers 27, 29. In this example, $Be_{0.13}Zn_{0.87}Se_{0.38}Te_{0.62}$ was used as the composition of the optical guide layers 27, 29.

Figure 3A:
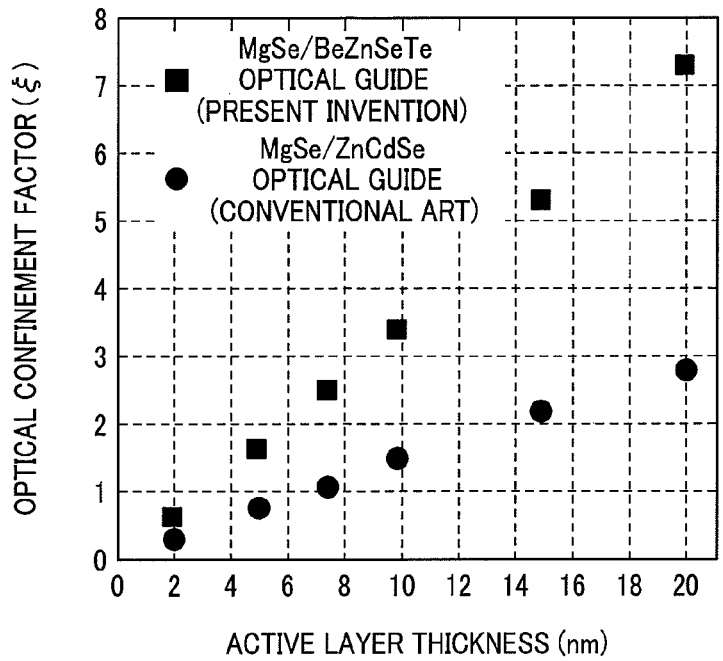
FIG. 3A is a graph showing comparison of the result of calculation for the dependence of the optical confinement factor to the active layer by an MgSe/ZnCdSe optical guide layer of an existent structure and the optical confinement factor to the active layer by an MgSe/BeZnSeTe optical guide layer of the structure of the invention on the thickness of a BeZnSeTe acting layer.
Figure 3B:
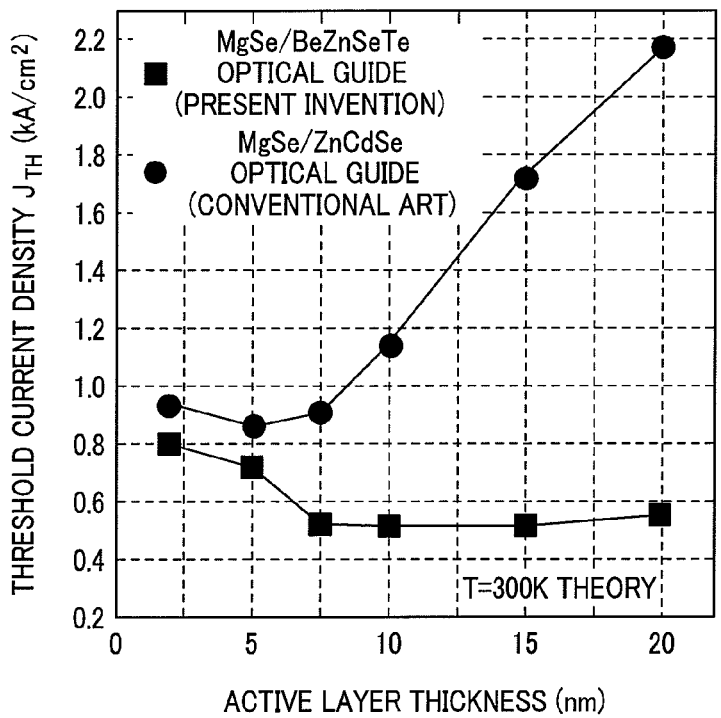
FIG. 3B is a graph showing comparison of the result of calculation for the dependence of the threshold current density in each of the semiconductor lasers of the existent structure and the semiconductor laser of the invention on the thickness of the BeZnSeTe active layer.

Then, the characteristics of the existent structure (FIGS. 1A, 1B) and the structure of the invention (FIGS. 2A, 2B) are compared by calculation. FIG. 3A shows the dependence of the optical confinement factor to the active layer 7 by the MgSe/ZnCdSe optical guide layer 6 of the existent structure and the optical confinement factor to the active layer 28 by the MgSe/BeZnSeTe optical guide layers 27, 29 of the structure according to the invention on the thickness of the BeZnSeTe active layer. Further, FIG. 3B shows the dependence of the laser threshold current density on the thickness of the BeZnSeTe active layer. The thicknesses of the n-side optical guide 27 and the p-side optical guide 29 of the structure of the invention are totally 200 nm such that the optimal characteristics are obtained.

As can be seen from FIG. 3A, the optical confinement factor in the structure of the invention is twice as large as the existent structure. This is mainly attributable to the fact that the effective refractive index 2.74 of the MgSe/BeZnSeTe superlattice of the optical guide layers 27, 29 is larger than the effective refractive index 2.34 of the MgSe/ZnCdSe superlattice of the optical guide layer 6. Further, the optical confinement is at the maximum with the n-side optical guide layer 27 having a thickness of up to 150 nm and the p-side optical guide layer 29 having a thickness of up to about 50 nm. This is because the refractive index of the n-cladding layer 25 is smaller than that of the p-cladding layer 30. FIG. 3B shows a threshold current density in a case where the cavity length is 1 mm and the end face reflectance is 0.2, which was calculated by using the result of the optical confinement.

It was confirmed by the calculation that the threshold value of the laser using the optical guide layer 27, 29 of the invention can be made smaller than that of the existent example, reflecting the increase in the optical confinement effect. Particularly, at the 10 nm thickness of the active layer 28, the threshold value can be decreased to 500 A/cm$^2$. Further, the band gap can be adjusted by selecting the composition of the BeZnSeTe lattice matched with the InP substrate (refer to FIG. 5B). A type I superlattice can be obtained by using $Be_{0.13}Zn_{0.87}Se_{0.38}Te_{0.62}$ for the well layer and MgSe for the barrier layer. Accordingly, by using the MgSe/BeZnSeTe superlattice for the optical guide layers 27, 29, the two optical guide layers 27, 29 and the active layer 28 can form a type I double-hetero structure.

Accordingly, this structure prevents radiative recombination of injected carriers due to the type II light emission caused at the n-side end of the active layer, which is a problem in the existent example. The MgSe/BeZnSeTe superlattice shown here is a novel superlattice not found in the reports so far and this is one of prominent materials of the invention. As described above, the structure of the invention can be improved in accordance with the guidelines (1) to (3) above.

Further, in this example, since the thickness of MgSe is sufficiently thin as 1 ML in the optical guide layers 27, 29, each of the BeZnSeTe well layers is bonded therewith to form a mini-band. The energy level attributable to the mini-band can be controlled by adjusting the thickness of the BeZnSeTe well layer. It is important that the energy level is attributable to the mini-band in view of the application of the laser. In the semiconductor laser, for providing essential light and carrier confinement, it is necessary to efficiently inject carriers in the active layer in addition to the appropriate adjustment of the band gap for the cladding layer, the optical guide layer, and the active layer. As shown schematically in FIG. 1B and FIG. 2B, since the mini-band is formed over the entire superlattice including the well layer and the barrier layer, carrier conduction is possible in the direction vertical to the stacked superlattice films through the level. In order that the mini-band is formed over the entire superlattice including the well layer and the barrier layer, it is necessary that the MgSe thickness is 5 ML or less. As described above, it is one of the features of the invention to apply the Be-containing superlattice using the 1 to 5 ML thin film barrier layer.

The technique of growing crystals easily and at high quality shown by the guideline (4) is attained by applying the superlattice comprising the Be based II-VI having the composition identical with that of the active layer as the constituent element to the optical guide layer and the cladding layer. Usually, in the crystal growth, particularly, molecular beam epitaxy (MBE), the composition control for polynary crystals is conducted by precise control of the temperature of starting materials. Accordingly, in the case of continuously growing crystals of different composition, for example, $Be_{0.1}Zn_{0.9}Se_{0.1}Te_{0.9}$ and $Be_{0.2}Zn_{0.8}Se_{0.2}Te_{0.8}$, it is necessary to interrupt growing after growing the first layer till the temperature for the starting material is stabilized. Degradation of the surface of the first layer exposed to high temperature cannot be ignored. To prevent the degradation, a surface protective layer is formed thinly between both of them in some cases. However, since the surface protective layer is different from materials which are to be present in the crystal structure, it is not preferred.

According to the present invention, this is attained by the change of the structure of the superlattice without changing the composition of the layers for which different physical properties such as band gap and refractive index are required (active layer, optical guide layer, cladding layer). That is, specifications required for each of the layers are attained by using the well layer (BeZnSeTe in the example described above) and the barrier layer (MgSe) each having a predetermined composition and adjusting the thickness thereof. That is, the type I band lineup of the BeZnSeTe/MgSe superlattice can be obtained by selecting the composition for BeZnSeTe. Accordingly, a type I junction of high carrier injection efficiency is possible by preparing the active layer, the optical guide layer, and the cladding layer by combining BeZnSeTe/MgSe superlattice (constant BeZnSeTe composition) of different thicknesses. This can arrange the refractive index in the order of the active layer, the optical guide layer, and the cladding layer, thereby enabling a sufficient optical confinement.

Further, this can obtain not only the economical effect of shortening the time required for crystal growth but also obtain high quality crystals for improved reliability intended in the invention, that is, crystals of stable mixed crystal composition by continuous growing without interruption of the growing can be obtained easily. Further, in the invention, Zn irradiation is adopted upon forming the MgSe/BeZnSeTe superlattice for enhancing the quality of crystals. This is a method of removing a Se atmosphere in the MBE growing chamber in a short period by Zn irradiation for making the MgSe/BeZnSeTe boundary steep.

A relation between the existent known technique and the present invention is to be described. In the invention, carrier transportation by way of the mini-band formed in the superlattice of MgSe/BeZnZeTe, etc. is utilized. The mini-band and the carrier transportation by way of the mini-band are technique that have been well known for a long time. An example of utilizing the mini-band transportation to the semiconductor laser, particularly, a group II-VI semiconductor laser includes "semiconductor device having mini-band" in JP-A No. 8-250810 by Jefry Gadan, et al. JP-A No. 8-250810 intends to attain continuous-wave room temperature oscillation of a semiconductor laser and mentions to the effectiveness of the MgSe/MgSSe series materials also considering the group II-VI semiconductor. However, they intend for the group II-VI semiconductor formed on a GaAs substrate.

On the other hand, in the invention, an InP substrate is used and the group II-VI compound lattice matched with the InP substrate and containing Be is intended and the use of the MgSe/BeZnSeTe series material is proposed as a prominent material. This can attain the improved reliability as the essential subject for practical use.

Further, for the Zn irradiation, the inventors have hitherto attempted to control the group III-V/II-VI boundary (Kishino et al., Phys. Stat. Sol., 6, (2004) 1477-1486, or Jpn. J. Appl. Phys. Vol. 38 (1999) pp. 2598-2602) and ensure the steepness of the MgSe/ZnSeTe superlattice boundary or the ZnCdSe/BeZnTe superlattice boundary (Jpn. J. Appl. Phys. Vol. Part 1 No. 12 (2001) pp. 6747-6752). However, reports that systematically studied the Zn irradiation to the superlattice boundary and the optical characteristic have not been found so far including the reports by the present inventors.

In the invention, Zn irradiation is attempted in the course of forming the MgSe/BeZnSeTe superlattice of the optical guide layers 27, 29 and the high quality crystal growth technique and the band gap control technique shown by the guideline (4) are studied for the MgSe/BeZnSeTe superlattice.

Figure 4:
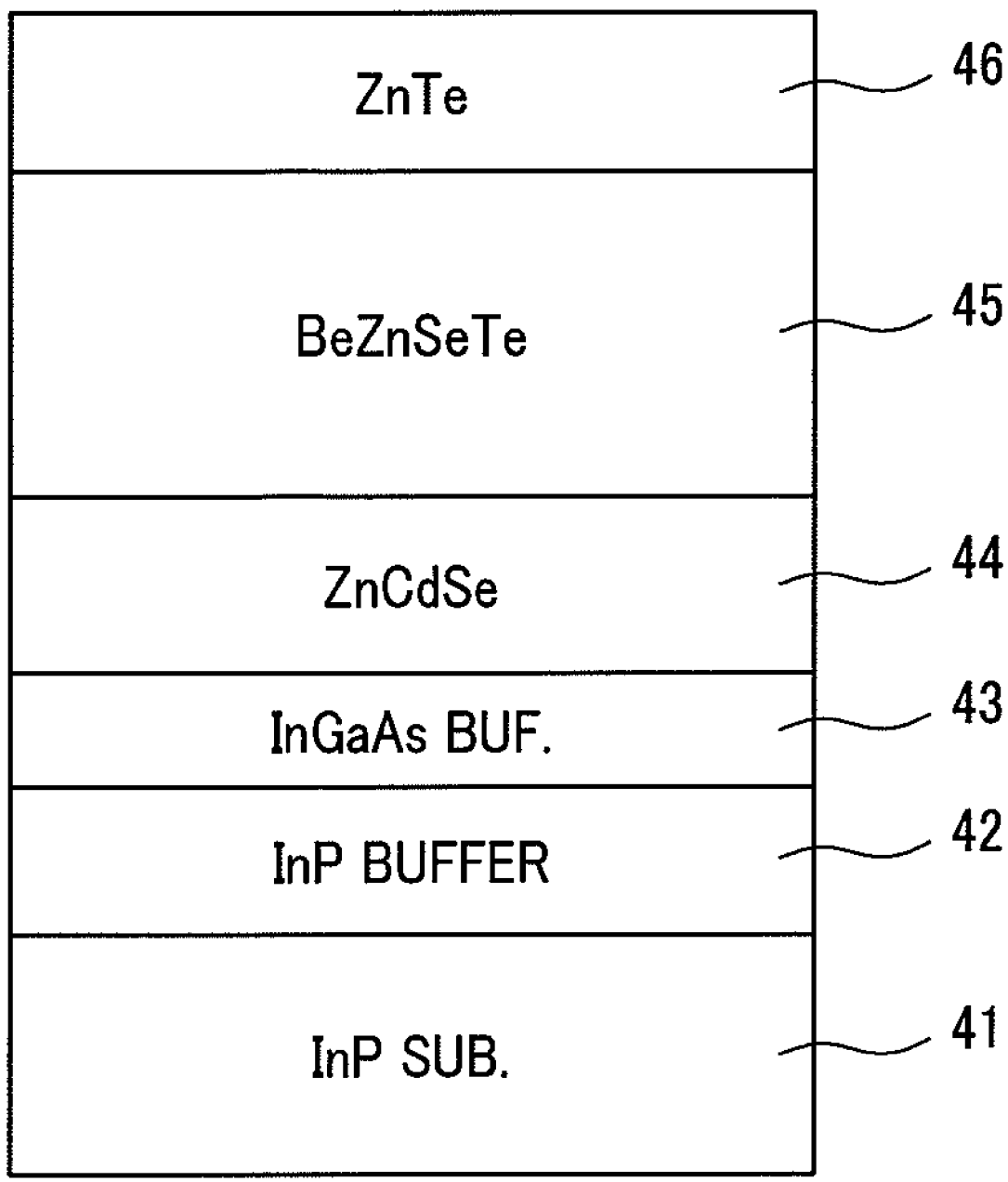
FIG. 4 is a schematic cross sectional view showing the structure of a BeZnSeTe sample.

FIG. 4 shows a manufactured sample structure. There are shown an InP substrate 41, an InP buffer layer 42, an InGaAs buffer layer 43, a ZnCdSe buffer layer 44, a BeZnSeTe layer 45 and a ZnTe cap layer 46.

The manufacturing procedures are as described below. At first, after applying an appropriate surface treatment to the InP substrate 41, it is set in an MBE (Molecular Beam Epitaxy) apparatus. Then, it is placed in a preparatory chamber for sample exchange, evacuated by a vacuum pump to $10^{-3}$ Pa or less, and heated up to 100° C. to dissociate residual water content and impurity gas. Then, it is conveyed to a group III-V exclusive growing chamber and the oxide film on the surface of the substrate is removed by heating the substrate to a temperature of 500° C. while irradiating P molecular beams to the surface of the InP substrate 41. Then, the InP buffer layer 42 (30 nm thickness) is grown at a substrate temperature of 450° C., and the InGaAs buffer layer 43 (200 nm thickness) is grown at a substrate temperature of 470° C. Then, the sample is conveyed to a group II-VI exclusive growing chamber and irradiation of Zn molecular beam at a substrate of temperature of 200° C. and growing of the ZnCdSe low temperature buffer layer 44 (100 nm thickness) were conducted, and then the BeZnSeTe layer 45 (500 nm thickness), substantially lattice-matched with the InP substrate, and the ZnTe cap layer 46 (5 nm thickness) were successively stacked at a substrate temperature of 300° C. In this case, six kinds of samples were prepared with the BeZnSeTe composition being varied. The samples were evaluated by an X-ray diffractometry method and a photoluminescence method (HeCd laser excitation, measured at room temperature).

Figure 5A:
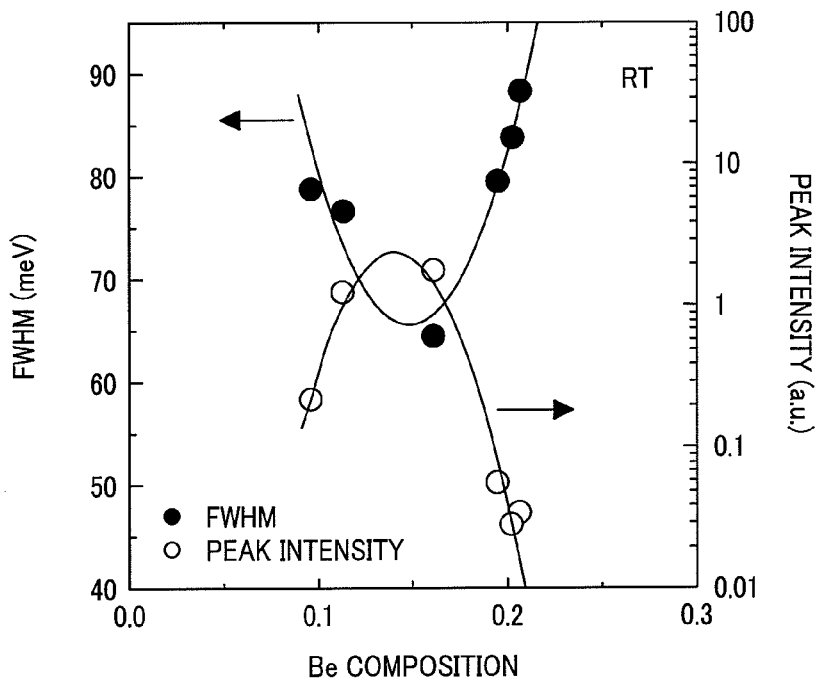
FIG. 5A is a graph showing a photoluminescence peak wavelength and a photoluminescence full width at half maximum value of a experimentally manufactured BeZnSeTe sample relative to a Be composition.

FIG. 5A shows a photoluminescence intensity at peak wavelength(ordinate on the right) and a photoluminescence full width at half maximum value (ordinate on the left) relative to a Be composition for the prepared six kinds of samples. The Be composition was calculated based on the lattice mismatching degree from the InP substrate by the X-ray diffractometry and the photoluminescence peak wavelength. The lattice mismatching degree of the samples shown in the drawing [(sample lattice constant)−(InP lattice constant)]/(InP lattice constant)] was 1% or less. The manufactured samples showed sufficient light emission at room temperature. Particularly, it has been found that a sample with the Be composition of 0.16 had excellent crystallinity since the light emission intensity was high and the full width at half maximum value was also narrow. In a sample with the lattice mismatching degree exceeding 1%, degradation was found in photoluminescence signals and X-ray diffraction signals. Further, in a specimen with the lattice mismatching degree exceeding 1%, degradation of the light emission intensity was remarkable. At the lattice mismatching degree of 1.5%, the light emission intensity was degraded by 1 digit or more. From the foregoing, it is considered that control of the lattice mismatching degree within 1% is one of criteria in a case of applying the present material series to the laser device.

Further, in the invention, mixed crystals (BeZnSeTe in this case) used for the active layer are also applied to portions of the optical guide layer and the cladding layer, thereby improving the crystallinity and making the growth efficient. However, in the actual crystal growth, it cannot be expected to completely align the composition of the mixed crystals used for the active layer with the composition of the mixed crystals used for the portion of the optical guide layer and the cladding layer. Then, in the actual crystal growth (MBE in this case), the reproducibility of the composition and the fluctuation of the composition in a case of intending to manufacture mixed crystals of an identical composition were estimated experimentally. As a result, it was found that the fluctuation of the composition in the BeZnSeTe series materials was about 30% also including the growth to different wafers. While the value depends on the growing apparatus and the material to be grown, this is considered to be a rough guide in the crystal growth. Further, the effect of the fluctuation in the composition of the optical guide layer and the cladding layer at about 30% fluctuation of the composition on the laser characteristic was estimated by the method shown in FIG. 3. As a result, it was found that the effect on the oscillation threshold value was as small as 5% or less, causing no practical problem. On the other hand, in a case where the Be composition of the optical guide layer is deviated by 40% relative to the Be composition of the active layer, the oscillation threshold value increases by 10% or more. A major cause is the reduction of the optical confinement to the active layer. With the investigation described above, the allowability for the fluctuation of the Be composition in the optical guide layer and the cladding layer relative to the Be composition in the active layer was defined as 30%.

Figure 5B:
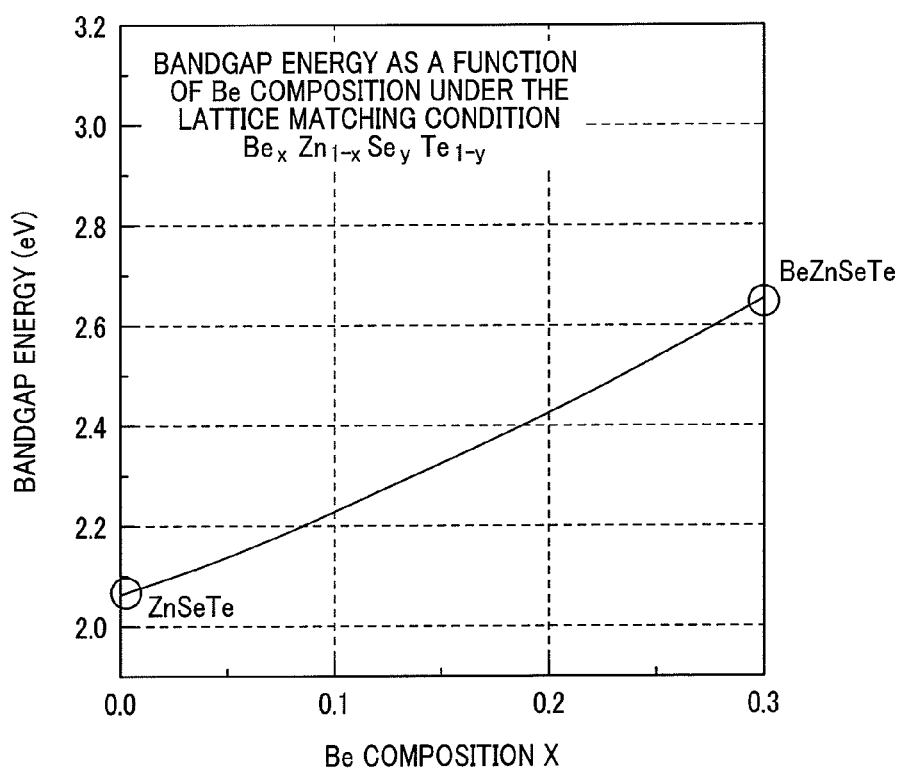
FIG. 5B is a graph showing the calculation value of the band gap energy of the BeZnSeTe sample lattice-matched to an InP substrate relative to a Be composition.

FIG. 5B shows the result of calculation for the relation between the band gap energy of a BeZnSeTe lattice matched with InP and a Be composition. Under the condition of lattice matching, the band gap of BeZnSeTe can be changed from 2.07 eV for ZnSeTe (Be composition=0) to 2.65 eV for BeZnTe (Be composition=0.3). Further, this system provides a direct transition in a region from 2.07 eV for ZnSeTe (Be composition=0) to 2.65 eV for BeZnSeTe (Be composition=0.3), and this is applicable to the active layer. The photoluminescence intensity at peak wavelength shown in FIG. 5A of the experimentally manufactured device shown in FIG. 4 showed a good coincidence with the result of calculation. The green light emission to be taken notice in the invention corresponds to the band gap energy up to 2.3 eV (Be composition up to 0.14). From FIG. 5A, it can be seen that BeZnSeTe having a Be composition in the vicinity thereof has a sufficient light emission intensity. BeZnSeTe is a main material dealt with in the invention.

Based on the result of the study described above, the following ratios are set for the composition in the invention regarding the composition of BeZnSeTe.

(1) Active layer $Be_{x1}Zn_{1-x1}Se_{Y1}Te_{1-y1}$ mixed crystal composition: [0.01<X1<0.3], particularly preferably, [0.1<X1<0.2].

(2) Active layer $Be_{x1}Zn_{1-x1}Se_{Y1}Te_{1-y1}$ lattice mismatching degree: 1% or less.

(3) $Be_{x2}Zn_{1-x2}Se_{Y2}Te_{1-y2}$ mixed crystal composition applied to the optical guide layer and cladding layer: fluctuation of the Be composition from the active layer $Be_{x1}Zn_{1-x1}Se_{Y1}Te_{1-y1}$ mixed crystal is 30% or less. That is, a relation of: 0.7×X1<X2<1.3×X1, and 0.7×Y1<Y2<1.3×Y1 should be satisfied.

Successively, MBE growing of the MgSe/BeZnSeTe superlattice was investigated.

Figure 6:
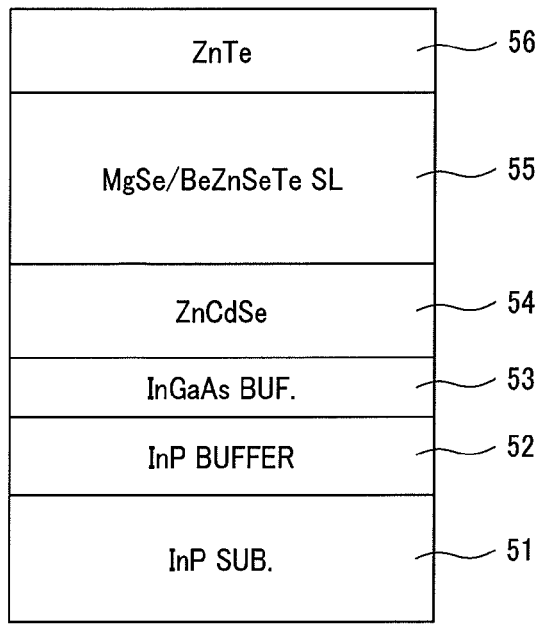
FIG. 6 is a schematic cross sectional view showing the structure of an MgSe/BeZnSeTe superlattice sample.

FIG. 6 shows an experimentally manufactured sample structure. Reference numeral 51 denotes an InP substrate; 52, an InP buffer layer; 53, an InGaAs buffer layer; 54, a ZnCdSe buffer layer; 55, an MgSe/BeZnSeTe superlattice layer; and 56, a ZnTe cap layer.

The manufacturing procedures are as described below. At first, after applying an appropriate surface treatment to the InP substrate 51, it was set in an MBE apparatus. It was placed in a preparatory chamber for sample exchange, evacuated by vacuum pump to $10^{-3}$ Pa or less, and heated up to 100° C. to dissociate residual water content and impurity gas.

Then, it was conveyed to a group III-V exclusive growing chamber and the oxide film on the surface of the substrate was removed by heating the substrate to a temperature of 500° C. while irradiating P molecular beams to the surface of the InP substrate 51. Then, the InP buffer layer 52 (30 nm thickness) was grown at a substrate temperature of 450° C., and the InGaAs buffer layer 53 (200 nm thickness) was grown at a substrate temperature of 470° C. Then, the sample was conveyed to a group II-VI exclusive growing chamber, Zn molecular beam irradiation and growing of ZnCdSe low temperature buffer layer 54 (100 nm thickness) were conducted at a substrate temperature of 200° C. and then an MgSe/$Be_{0.13}Zn_{0.87}Se_{0.38}Te_{0.62}$ superlattice layer 55 (500 nm thickness, 2 ML/8 ML), and ZnTe cap layer 56 (5 nm thickness) were stacked successively at a substrate temperature of 300° C.

The growing rate of MgSe/$Be_{0.13}Zn_{0.87}Se_{0.38}Te_{0.62}$ was set to 0.146 nm/sec and the growing rate of MgSe was set to 0.0175 nm/sec. Zn irradiation was attempted for the improvement of the film quality of the MgSe/BeZnSeTe superlattice.

Figure 7:
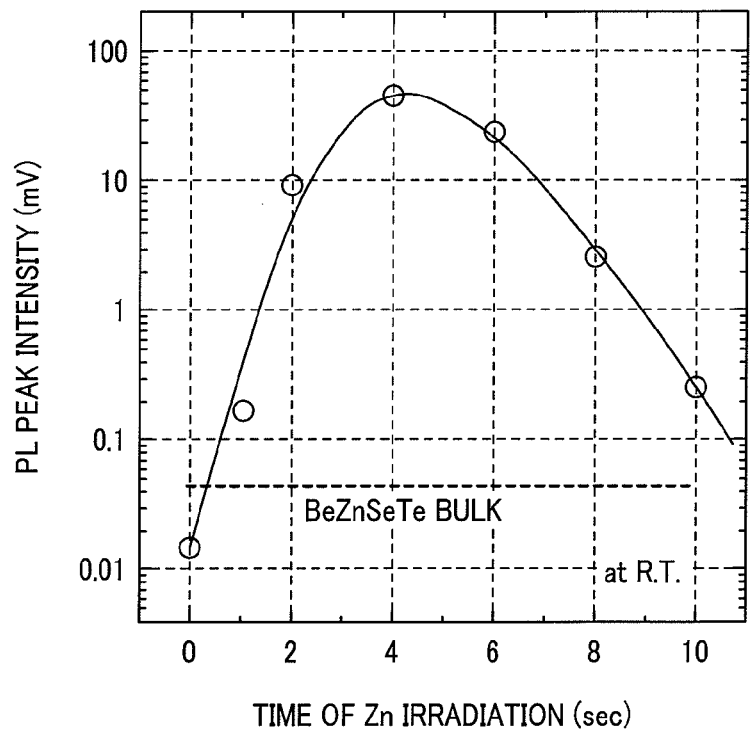
FIG. 7 is a graph showing a relation between the time of Zn irradiation and the photoluminescence emission intensity of the MgSe/BeZnSeTe superlattice.

Improvement for the crystallinity by Zn irradiation is a method frequently used so far in the MBE growing of the group II-VI semiconductor. For example, there are reports of using the method for the pre-growing treatment for the III-V/II-VI boundary (Kishino et al Phys. Stat. Sol., 6, (2004) 1477-1486), and upon layer switching of the MgSe/BeZnTe superlattice (Jpn. J. Appl. Phys, Vol. 38 (1999) pp. 2598-2602). In this case, Zn irradiation was conducted for a predetermined time before and after the BeZnSeTe growing for the MgSe/BeZnSeTe superlattice and a relation between the time of Zn irradiation and the photoluminescence intensity of the manufactured sample was studied systematically. FIG. 7 shows the result. The abscissa indicates the time of Zn irradiation and the ordinate indicates the peak value for the photoluminescence intensity. The photoluminescence intensity was measured at a room temperature using an HeCd laser as a excitation light source. In a case of Zn irradiation for 4 sec, the photoluminescence intensity was at the maximum which showed increase by about four digits compared with a case not conducting Zn irradiation. It is considered since the group VI elements of Se and Te in the MBE chamber are consumed by Zn irradiation, this can suppress intrusion of Se, Te in the succeeding growing of hetero elements and, as a result, a steep hetero boundary is formed. A line described as BeZnSeTe bulk shown in FIG. 7 is a value for the photoluminescence intensity in the BeZnSeTe bulk (with no MgSe layer). Further, when the sample was observed with a transmission type electron microscope, a layer of about 1ML considered to be Zn was found at the superlattice hetero boundary in the specimen applied with Zn irradiation for 4 sec or more.

In the reports described above, a correlation between the Zn irradiation and the crystallinity of the superlattice crystals was not mentioned. Further, there was no report regarding the MgSe/BeZnSeTe superlattice system, and the improvement for the crystallinity by the Zn irradiation in this system is a novel finding obtained by the invention. That is, Zn irradiation in the course of forming the MgSe/BeZnSeTe superlattice and formation of the thin Zn film layer at the hetero boundary as a result thereof can be said to be one of features of the method of manufacturing MgSe/BeZnSeTe superlattice according to the invention and the superlattice structure by the manufacturing method. In the invention, the thin Zn film layer to be formed is one of the compositions of the BeZnSeTe superlattice layer and the presence thereof gives no problems.

Then, to examine the possibility of applying the MgSe/BeZnSeTe superlattice to the laser, the band structure was investigated. In this case, the change of the light emission wavelength was examined systematically by changing the thickness of the $Be_{0.13}Zn_{0.87}Se_{0.38}Te_{0.62}$ layer while keeping the thickness of the MgSe layer constant at 2 ML. The specimen structure and the growing condition are identical with those of FIG. 6 except for changing the thickness of the MgSe/BeZnSeTe superlattice. The time of Zn irradiation was set to 4 sec on the basis of the result of the preceding drawing.

Figure 8:
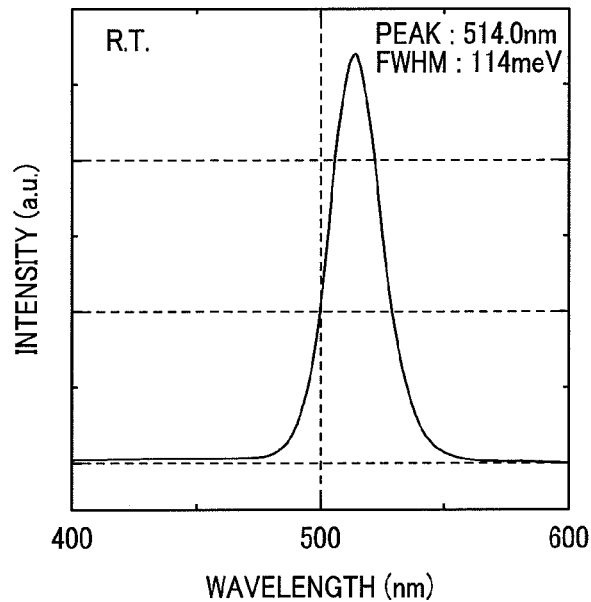
FIG. 8 is a graph showing the photoluminescence spectrum of an MgSe/BeZnSeTe superlattice.

FIG. 8 shows a photoluminescence spectrum of the 2 ML MgSe layer and the 8 ML BeZnSeTe layer superlattice at a room temperature. The abscissa indicates the wavelength and the ordinate indicates the photoluminescence intensity. The peak wavelength was 514 nm and the full width at half maximum value was 114 meV. In this case, the thickness ratio of the MgSe layer in the superlattice, that is, the MgSe layer thickness/(MgSe layer thickness+BeZnSeTe layer thickness) is: 2ML/(2ML+8ML)=0.2.

Figure 9:
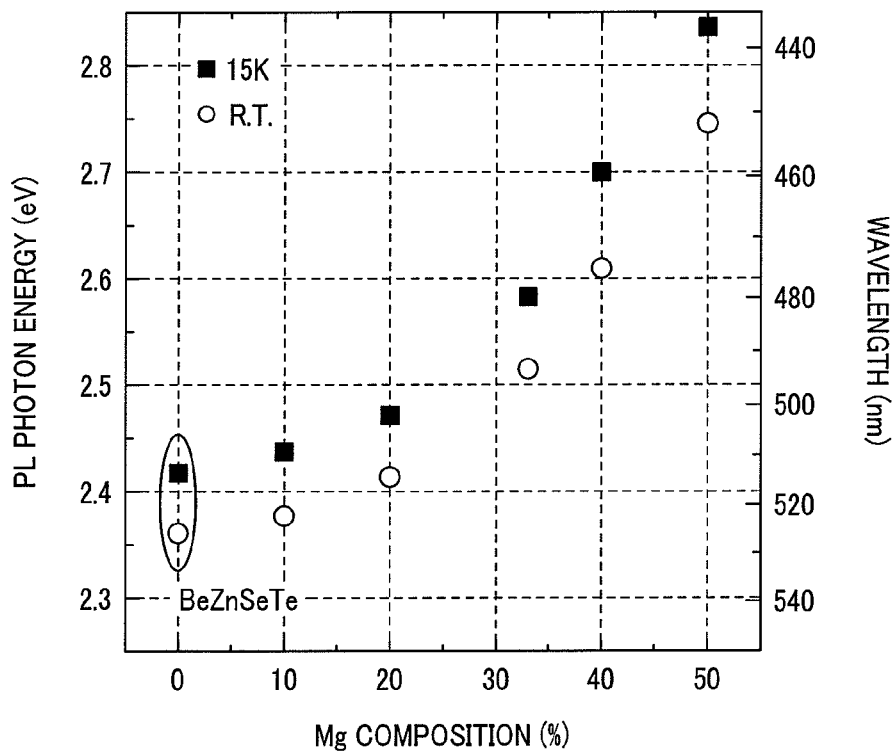
FIG. 9 is a graph showing a relation between the Mg composition of an MgSe/BeZnSeTe superlattice and photoluminescence emission energy.

Superlattices were manufactured while changing the thickness of BeZnSeTe to 18 ML, 8 ML, 4 ML, 3 ML and 2 ML while the MgSe layer has a thickness of 2 ML. Accordingly, the thickness ratio of the MgSe layer is 0.1, 0.2, 0.33, 0.4, and 0.5, respectively. FIG. 9 shows the peak wavelength of the photoluminescence (axis on the light) and the photon energy of the photoluminescence (axis on the left) of the samples measured at 15K and at a room temperature. The abscissa indicates the film thickness ratio of the MgSe layer as "Mg composition". For comparison, a measured value for BeZnSeTe bulk (with no MgSe layer) was shown being surrounded with an ellipse.

As can be seen from FIG. 9, as the film thickness ratio: Mg composition of the MgSe layer is larger, the peak wavelength shifted toward the higher energy side (shorter wavelength side). This is due to the well-known quantum well effect in the superlattice.

In this system, since the thickness of the MgSe layer is sufficiently thin as 2ML, respective BeZnSeTe well layers are joined to form a mini band. As the thickness of the BeZnSeTe well layer is narrower (Mg composition increases), the transition energy between the mini band formed in the valence electron band and the conduction band is larger. As a result, as the Mg composition increases, the peak energy shown in FIG. 8 increases. As described above, by adjusting the thickness of the BeZnSeTe well layer, the energy level due to the miniband can be controlled from 2.35 eV to 2.75 eV (room temperature).

It is important that the energy level is attributable to the mini-band in view of the laser application. In the semiconductor laser, to attain required light emission and carrier confinement, it is necessary to efficiently inject carriers into the active layer in addition to proper adjustment for the band gap of the cladding layer, the optical guide layer, and the active layer. Since the mini-band is formed over the entire superlattice including the well layer and the barrier layer as schematically shown in FIGS. 1A, 1B, and FIGS. 2A, 2B, carriers can be conducted through the level in the direction perpendicular to the superlattice stacked films. The band gap in this case substantially corresponds to the peak energy in FIG. 9. Accordingly, the result of FIG. 9 shows a possibility that the cladding layer, the optical guide layer, and the active layer of the semiconductor laser can be constituted by combining MgSe/BeZnSeTe superlattice of different thickness.

Figure 10:
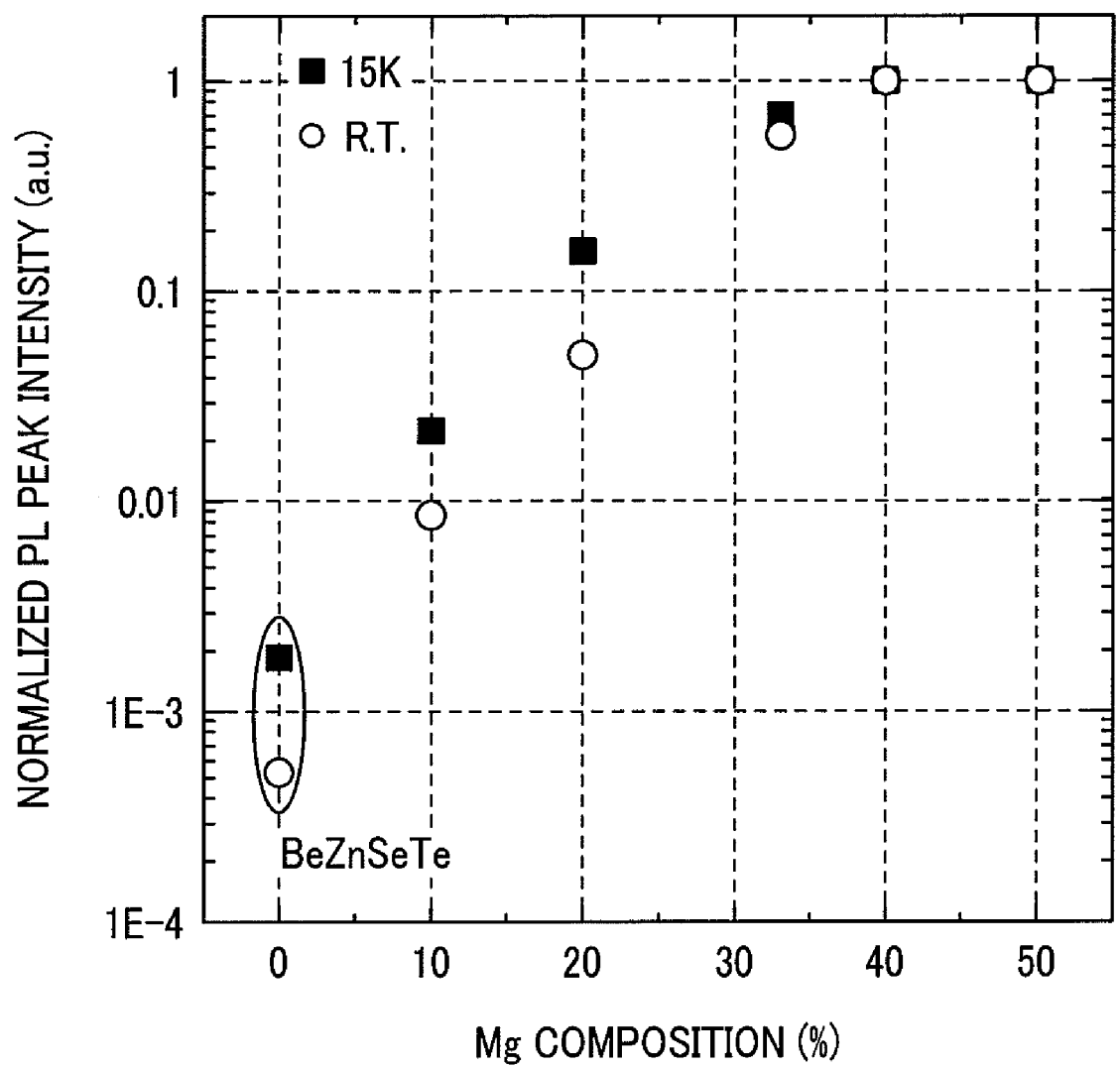
FIG. 10 is a graph showing a relation between the Mg composition of an MgSe/BeZnSeTe superlattice and the photoluminescence emission intensity.

FIG. 10 shows a normalized photoluminescence peak intensity of the MgSe/BeZnSeTe superlattice described above while indicating the film thickness ratio: Mg composition of the MgSe layer on the abscissa. The photoluminescence peak intensity is one of rough indications of the crystallinity. In the superlattice sample, a signal intensity stronger by one digit to three digits was observed in accordance with the Mg composition compared with the value of a bulk (Mg composition=0) indicated being surrounded with an ellipse by the photoluminescence measurement at a room temperature. From the foregoing, it is considered that the experimentally manufactured superlattice has such a quality as applicable to the cladding layer, the optical guide layer, and the active layer of the semiconductor layer.

While the enhancement of the light emission intensity in the superlattice is a usually observed phenomenon, enhancement of the light emission intensity in the MgSe/BeZnSeTe lattice system is worth notice. Generally, it is difficult for MgSe to prepare crystals with good quality since it tends to be in a rocksalt crystal structure different from usual group II-VI semiconductors having a Zincblende type crystal structure, etc. In this experimental manufacture, sufficient crystal quality could be ensured by reducing the thickness of MgSe to 2ML and improving the superlattice boundary by Zn irradiation.

To apply the MgSe/BeZnSeTe superlattice to the cladding layer of the semiconductor layer, it is necessary to realize a wide band gap over 2.6 eV and high doping at about $10^{18}$ $cm^{-3}$. For n-cladding application, the MgSe/BeZnSeTe superlattice is applicable because an effective donor concentration of $1 \times 10^{18}$ $cm^{-3}$ can be attained.

Here, we propose the new cladding structure based on the MgSe/BeZnSeTe superlattice. The clad can be applied not only for n-type cladding layers but also for p-type cladding layers.

The method is similar to that reported so far by the inventors, et al. in the p-ZnCdSe/ZnTe superlattice (Saito, et al., The 66th Academic Lecture of The Japan Society of Applied Physics, 7a-ZA-7). The reason why p-doping at a high concentration could be attained in the superlattice is due to the ZnTe layer newly introduced.

The invention shows that the method for the p-ZnCdSe/ZnTe superlattice is applicable to the MgSe/BeZnSeTe superlattice where the MgSe/BeZnSeTe superlattice acts as the matrix corresponding to the ZnCdSe for the previous structure and the third layer is newly introduced for high doping.

Figure 11A:
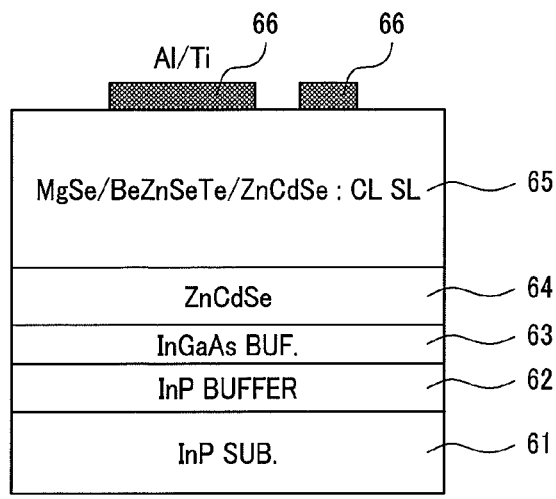
FIG. 11A is a schematic cross sectional view of an n-MgSe/BeZnSeTe/ZnCdSe superlattice sample structure for measurement of a carrier concentration.
Figure 11B:
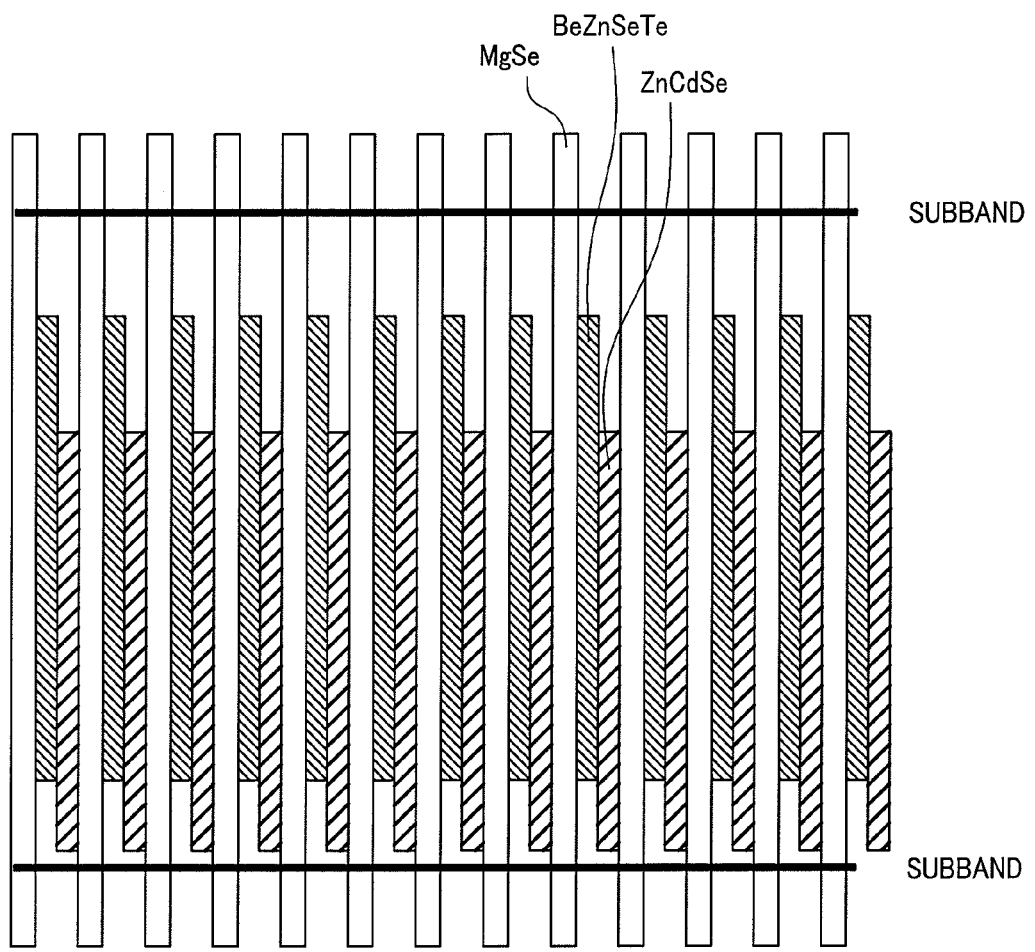
FIG. 11B is a view showing a band line-up of a sample structure.

FIG. 11A shows a structure of an MgSe/BeZnSeTe/ZnCdSe superlattice sample for n-cladding layer and FIG. 11B shows a band line-up of the superlattice sample. Reference numeral 61 denotes an InP substrate; 62, an InP buffer layer; 63, an InGaAs buffer layer; 64, a ZnCdSe buffer layer; 65, a Cl-doped MgSe/BeZnSeTe/ZnCdSe superlattice layer; and 66, an Al/Ti Schottky type electrode.

At first, after applying an appropriate surface treatment to the InP substrate 61, it was set in an MBE apparatus. They were placed in a preparatory chamber for sample exchange, evacuated by a vacuum pump to $10^{-3}$ Pa or lower, heated to 100° C. to dissociate residual water content and impurity gas. Then, they were conveyed to a group III-V exclusive growing chamber, and heated to a substrate temperature of 500° C. while irradiating P molecular beam to the substrate surface to remove the oxide film on the substrate surface, then an InP buffer layer 62 (30 nm thickness) was grown at a substrate temperature of 450° C. and an InGaAs buffer layer 63 (200 nm thickness) was grown at a substrate temperature of 470° C. Then, the sample was conveyed to a group II-VI exclusive growing chamber to conduct Zn molecular beam irradiation and growing of a ZnCdSe low temperature buffer layer 64 (100 nm thickness) at a substrate temperature of 200° C. and then MgSe/Be$_{0.13}$Zn$_{0.87}$Se$_{0.38}$Te$_{0.62}$/Zn$_{0.48}$Cd$_{0.52}$Se superlattice (3 Ml/2 ML/1 ML) n-layer (0.5 µm thickness) 65 were successively stacked. ZnCl$_2$ was used for n-doping. Then, a Schottky type electrode 66 was formed by vapor deposition of Ti and Al and patterning by a resist and light exposure. A capacitance-voltage (C-V) measurement was conducted at a room temperature by using the electrode, to determine an effective donor n-doping concentration at the MgSe/BeZnSeTe/ZnCdSe superlattice layer. An effective donor concentration of $3 \times 10^{17}$ to $3 \times 10^{18}$ $cm^{-3}$ was obtained by changing the doping amount of ZnCl$_2$.

The reason why n-doping at a high concentration could be attained in the superlattice is that the n-type high concentration doping to newly introduced ZnCdSe is possible. That is, a carrier concentration necessary for the n-cladding layer is ensured by the third layer ZnCdSe layer introduced to the superlattice (n-layer 65) thereby attaining a necessary band gap (transition energy between mini-bands) necessary for the n-cladding layer. For the third layer as the carrier supply layer in the superlattice clad, a sufficient effect can be obtained also by ZnSe, CdSe, BeSe, BeZnSe, MgZnSeTe, ZnSeTe, BeCdSe, MgZnCdSe, MgZnSe, or MgCdSe layer in addition to ZnCdSe.

Further, for the lattice matching with the InP substrate 61, the strain over the entire superlattice can be offset by adjusting the strain and thickness for each layer in one period of MgSe/BeZnSeTe/ZnCdSe.

Next, the case of p-doing is shown. Then, p-doping with radical nitrogen was attempted for a similar sample structure. However, no sufficient acceptor concentration could be obtained by the MgSe/BeZnSeTe superlattice. Then, p-doping to the superlattice with addition of ZnSeTe to the MgSe/BeZnSeTe superlattice was newly attempted.

Figure 12A:
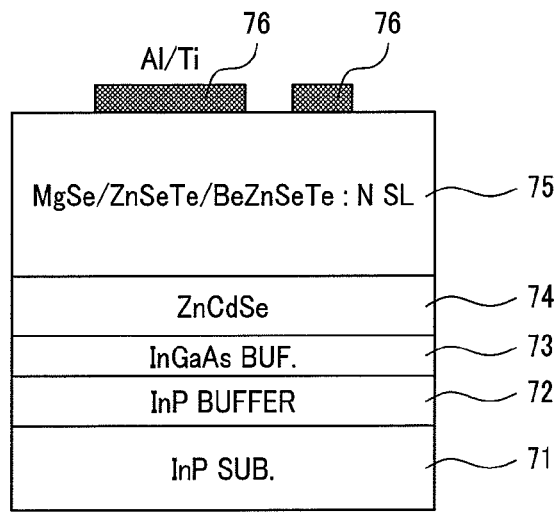
FIG. 12A is a schematic cross sectional view of a p-MgSe/ZnSeTe/BeZnSeTe superlattice sample structure for measurement of a carrier concentration.
Figure 12B:
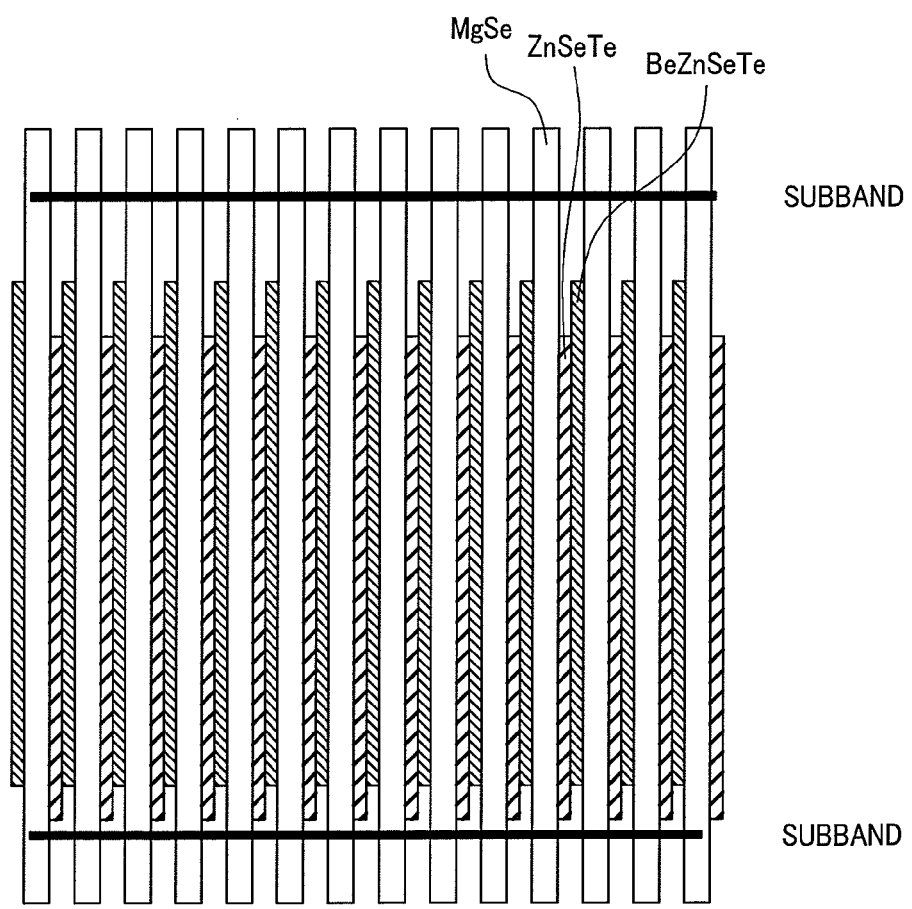
FIG. 12B is a view showing the band line-up of the sample structure.

FIG. 12A shows the structure of a MgSe/ZnSeTe/BeZnSeTe superlattice (3 ML/1 ML/2 ML) sample for p-cladding layer and FIG. 12B shows a band line-up of the MgSe/ZnSeTe/BeZnSeTe superlattice in the structure. Reference numeral 71 denotes an InP substrate; 72, an InP buffer layer; 73, an InGaAs buffer layer; 74, a ZnCdSe buffer layer; 75, a nitrogen (N)-doped MgSe/ZnSeTe/BeZnSeTe superlattice layer; and 76, an Al/Ti Schottky type electrode.

At first, after conducting an appropriate surface treatment to the InP substrate 71, it was set in an MBE apparatus. It was placed in the preparatory chamber for sample exchange, evaluated by a vacuum pump to $10^{-3}$ Pa or less, and heated to 100° C. to dissociate residual water content and impurity gap. Then, it was conveyed to a group III-V exclusive growing chamber and heated to a substrate temperature of 500° C. while irradiating p-molecular beams to the substrate surface to remove oxide films on the substrate surface. Then, the InP buffer layer 72 (30 nm thickness) was grown at a substrate temperature of 450° C., and the InGaAs buffer layer 73 (200 nm thickness) was grown at a substrate temperature 470° C. Then, the sample was conveyed to a group II-VI exclusive growing chamber, Zn molecular beam irradiation and growing of the ZnCdSe low temperature buffer layer 74 (100 nm thickness) were conducted at a substrate temperature of 200° C. and then the MgSe/ZnSe$_{0.48}$Te$_{0.52}$/Be$_{0.13}$Zn$_{0.87}$Se$_{0.38}$Te$_{0.62}$ superlattice (3 ML/1 ML/2 ML) p-layer (0.5 µm) was stacked at a substrate temperature of 300° C. successively. Growing was conducted while applying radical nitrogen doping for the p-doping.

Then, the Schottky type electrode 76 is formed by vapor deposition of Ti and Al and pattering by resist and light exposure. Capacitance-voltage (C-V) method measurement was conducted at a room temperature by using electrode to determine the effective acceptor (p-doping) concentration at the MgSe/ZnSeTe/BeZnSeTe superlattice layer. The obtained maximum acceptor concentration was $1\times10^{18}$ cm$^{-3}$. The reason why the p-doping could be attained by the superlattice is that p-doping at high concentration to the newly introduced ZnSeTe layer 74 is possible in the same manner as the n-cladding layer shown in FIG. 11. That is, carrier concentration necessary for p-cladding layer is ensured by the ZnSeTe layer in the superlattice layer 75 to attain a band gap (transition energy between mini-bands) necessary for the cladding in the MgSe/BeZnSeTe layer.

A sufficient effect can be obtained for the carrier supply layer also by a ZnBeTe, ZnTe, MgZnSeTe, BeTe, or MgZnTe layer in addition to the ZnSeTe layer. Further, for the lattice matching with the InP substrate 71, strains over the entire superlattice can be offset by adjusting the strain and the film thickness in each of the layers in one period of MgSe/ZnSeTe/BeZnSeTe.

Further, a possibility for the case not inserting the third layer ZnSeTe layer in the superlattice layer 75, that is, a possibility of the p-cladding layer of the MgSe/BeZnSeTe superlattice was investigated. The maximum acceptor concentration of the superlattice examined by the same method as that in FIG. 12 was $5\times10^{17}$ cm$^{-3}$. Compared with the superlattice having the third layer described above, this superlattice had a large transition energy between mini-bands and is effective not only as the p-cladding layer but also as an electron block layer.

Effectiveness of applying the MgSe/BeZnSeTe superlattice with the thickness of the BeZnSeTe substantially lattice matched with InP being changed to the optical guide layer and the cladding layer for enhancing the reliability and attaining the continuous-wave oscillation at room temperature of the semiconductor laser that oscillates at green light and yellow light is shown based on the studies described above. FIG. 13A to FIG. 15B shows specific examples.

Figure 13A:
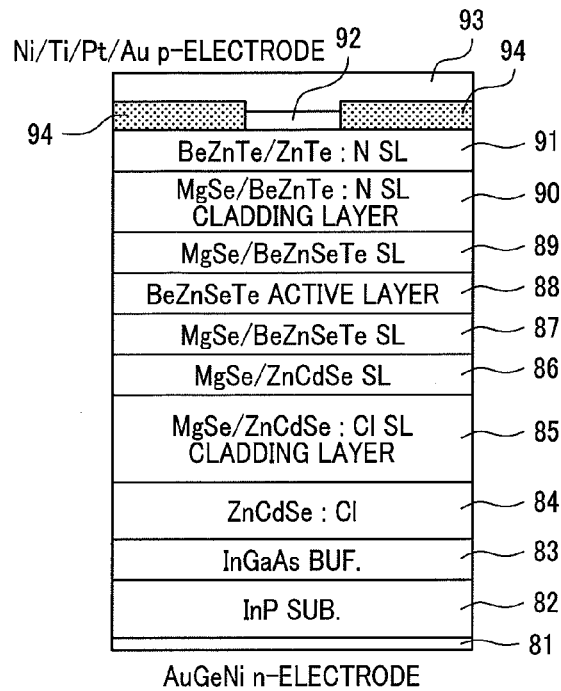
FIG. 13A is a schematic cross sectional view showing a semiconductor laser structure of an example of the present invention.
Figure 13B:
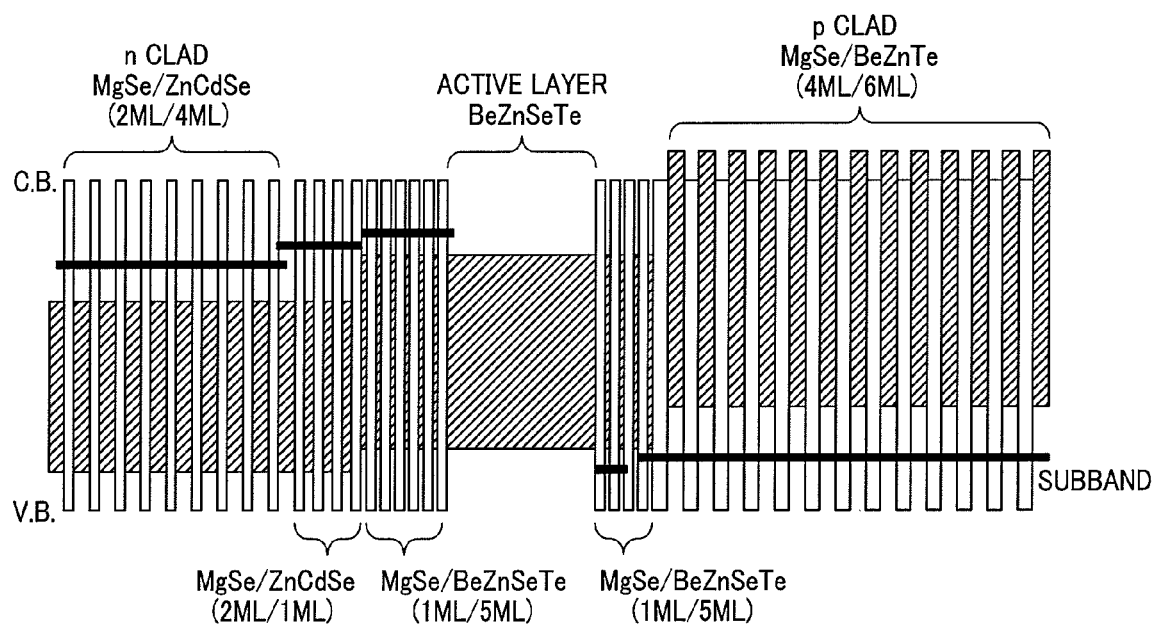
FIG. 13B is a view showing a band line-up of the semiconductor laser structure.

FIGS. 13A and 13B show an example of applying BeZnSeTe to the active layer and the MgSe/BeZnSeTe superlattice substantially lattice matched with InP to the optical guide layer. FIG. 13A shows the structure of a semiconductor laser and FIG. 13B shows a band line-up. In FIGS. 13A and 13B, reference numeral 81 denotes an n-electrode comprising AuGeNi; 82, an InP substrate; 83, an InGaAs buffer layer; 84, a Cl-doped ZnCdSe buffer layer; 85, a lower cladding layer comprising a Cl-doped MgSe/ZnCdSe superlattice; 86, a thick stepped superlattice layer comprising an MgSe/ZnCdSe superlattice; 87, an n-side optical guide comprising an MgSe/BeZnSeTe superlattice layer; 88, a BeZnSeTe active layer; 89, a p-side optical guide comprising an MgSe/BeZnSeTe superlattice layer; 90, an upper cladding layer comprising N-doped MgSe/BeZnTe superlattice; 91, an N-doped BeZnTe/ZnTe superlattice layer; 92, an N-doped ZnTe cap layer; 93, a p-electrode comprising Ni/Ti/Pt/Au; and 94, an insulative layer. In the present invention, BeZnSeTe was used for the active layer 88 and an MgSe/BeZnSeTe optical guide layers 87, 89 having an identical BeZnSeTe composition were disposed on both sides thereof.

Manufacturing procedures are shown below. At first, after applying an appropriate surface treatment to the InP substrates 82, it was set in an MBE apparatus. After placing it in a preparatory chamber for sample exchange, it was evacuated by a vacuum pump to $10^{-3}$ Pa or lower, and heated up to 100° C. to dissociate residual water content and impurity gas. Then, it was conveyed to a group III-V exclusive growing chamber and heated to a substrate temperature of 500° C. while irradiating P molecular beams to the substrate surface to remove oxide films on the substrate surface. Then, the InGaAs buffer layer 83 (200 nm thickness) was grown at a substrate temperature of 470° C. Then, the sample was conveyed to a group II-VI exclusive growing chamber and irradiation of Zn molecular beams and growing of the ZnCdSe low temperature buffer layer 84 (100 nm thickness) were conducted at a substrate temperature of 200° C. Then, at the substrate temperature of 280° C., the n-MgSe/$Zn_{0.48}Cd_{0.52}Se$(2 ML/4 ML) superlattice cladding layer 85 (800 nm thickness) and the n-MgSe/$Zn_{0.48}Cd_{0.52}Se$(2 ML/1 ML) superlattice cladding layer 86 (20 nm thickness) were formed and, successively, at a substrate temperature of 300° C., the MgSe/$Be_{0.13}Zn_{0.87}Se_{0.38}Te_{0.62}$ (1 ML/5 ML) superlattice optical guide layer 87 (20 nm thickness), the $Be_{0.13}Zn_{0.87}Se_{0.38}Te_{0.62}$ single quantum well active layer 88 (7.5 nm thickness), the MgSe/$Be_{0.13}Zn_{0.87}Se_{0.38}Te_{0.62}$ (1 ML/5 ML) superlattice optical guide layer 89 (5 nm thickness), the MgSe/$Be_{0.48}Zn_{0.52}Te$ (4 ML/6 ML) superlattice p-cladding layer 90 (0.5 μm thickness), the MgSe/$Be_{0.48}Zn_{0.52}Te$ superlattice layer 91 (50 nm thickness), and the ZnTe cap layer 92 (5 nm thickness) were stacked successively. Then, the ZnTe cap layer 92 was fabricated into a stripe shape of 10 μm width by bromine-based wet etching. After forming the SiN insulative film 94 by a plasma CVD process, a p-electrode connection portion of the SiN insulative film is removed. The p-electrode 93 comprising Ni/Ti/Pt/Au was formed by electron-beam evaporation. A lift off method by photoresist was used for the fabrication into the electrode shape. After alloying the p-electrode 93 at 300° C., the InP substrate 82 was polished to 100 μm, and an n-electrode 81 comprising AuGeNi was vapor deposited to the rear face. In this case, growing was conducted while applying $ZnCl_2$ for n-doping and radical nitrogen for p-doping. In the growing of the MgSe/BeZnSeTe superlattice and the MgSe/BeZnTe superlattice, Zn irradiation was conducted for 4 sec before growing of the respective layers of the superlattice.

A laser structure of 1 mm device length was manufactured by cleaving. The device of this example oscillated at a room temperature by driving with 150 mA DC current. The oscillation wavelength was 560 nm. The reason why the room temperature oscillation could be attained by the laser structure of this example which was modified from the existent example shown in FIGS. 1A, 1B is considered to be attributable to the following effects shown by the result of study described above.

(1) Improvement for optical confinement by the MgSe/BeZnSeTe optical guide.

(2) Increase of the efficiency of injecting carriers to the active layer due to the prevention of the type II light emission at the n-side end of the active layer by the MgSe/BeZnSeTe optical guide.

(3) it is expected that also the improvement for the crystallinity by Zn irradiation and by the use of BeZnSeTe having the identical composition for the active layer and the superlattice optical guide layer contribute to the improvement of the characteristic.

Figure 14A:
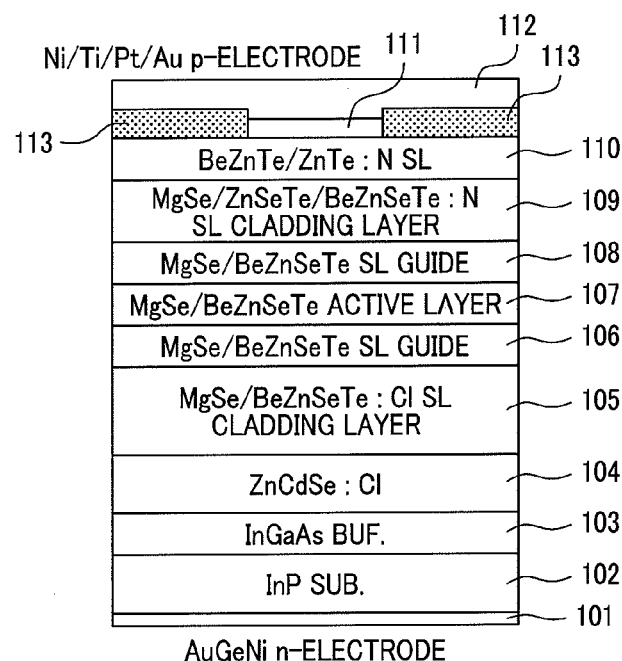
FIG. 14A is a schematic cross sectional view showing a semiconductor laser structure of another example of the present invention.
Figure 14B:
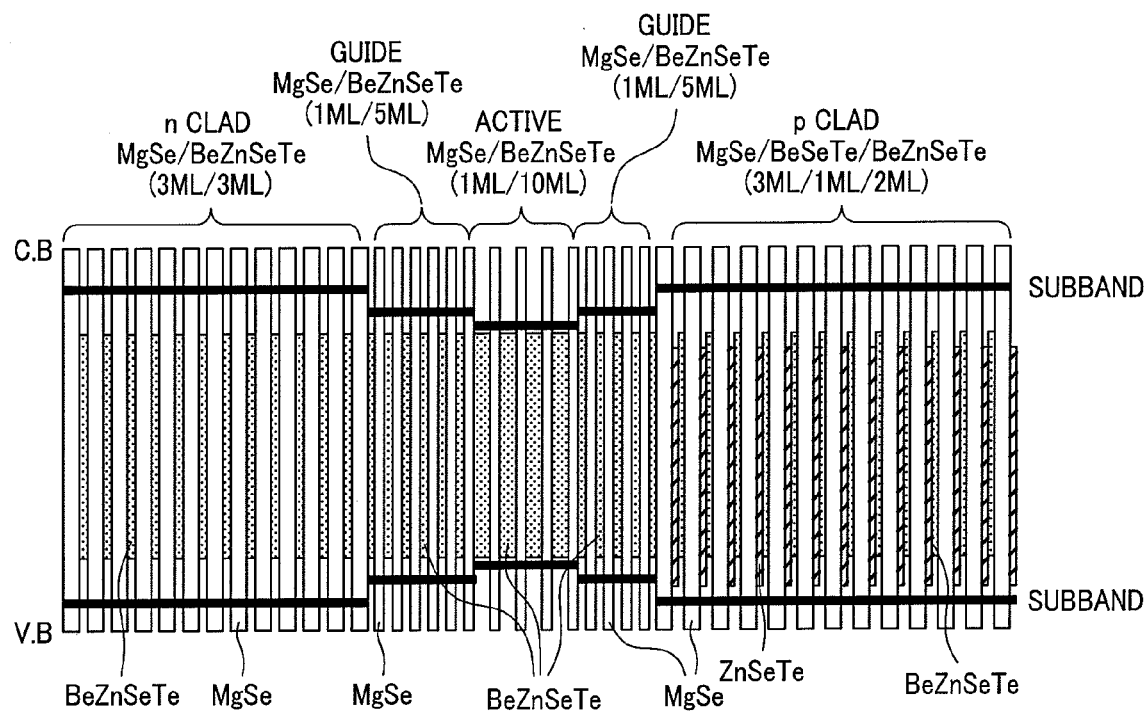
FIG. 14B is a view showing a band line-up of the semiconductor laser structure.

FIGS. 14A, 14B show an example of applying MgSe/BeZnSeTe for the active layer, MgSe/BeZnSeTe superlattice substantially lattice-matched with InP for the lower cladding layer and the optical guide layer, and the MgSe/ZnSeTe/BeZnSeTe superlattice substantially lattice-matched with InP for the upper cladding layer. FIG. 14A shows the structure of a semiconductor laser and FIG. 14B shows a band line-up.

In FIGS. 14A, 14B, reference numeral 101 denotes an n-electrode comprising AuGeNi; 102, an InP substrate; 103, an InGaAs buffer layer; 104, a Cl-doped ZnCdSe buffer layer; 105, a lower cladding layer comprising a Cl-coped MgSe/

BeZnSeTe superlattice; 106, an n-side optical guide comprising an MgSe/BeZnSeTe superlattice layer; 107, an MgSe/BeZnSeTe active layer 107; 108, a p-side optical guide comprising an MgSe/BeZnSeTe superlattice layer; 109, an upper cladding layer comprising an N-doped MgSe/ZnSeTe/BeZnSeTe superlattice; 110, an N-doped BeZeTe/ZnTe superlattice layer; 111, an N-doped ZnTe cap layer; 112, a p-electrode comprising Ni/Ti/Pt/Au; and 113, an insulative layer. In this example, in comparison with the example shown in FIGS. 13A, 13B, MgSe/BeZnSeTe was used instead of BaZnSeTe for the active layer 107, the lower cladding layer 105 was formed of the Cl-doped MgSe/BeZnSeTe superlattice, and the upper cladding layer 109 was formed of the N-doped MgSe/ZnSeTe/BeZnSeTe superlattice.

Manufacturing procedures are shown below. At first, after applying an appropriate surface treatment to the InP substrates 102, it was set in an MBE apparatus. After placing it in a preparatory chamber for specimen exchange, it was evacuated by a vacuum pump to $10^{-3}$ Pa or lower, and heated up to 100° C. to dissociate residual water content and impurity gas. Then, it was conveyed to a group III-V exclusive growing chamber and heated to a substrate temperature of 500° C. while irradiating P molecular beams to the substrate surface to remove oxide films on the substrate surface. Then, the InGaAs buffer layer 103 was grown to 200 nm thickness at a substrate temperature of 470° C. Then, the sample was conveyed to a group II-VI exclusive growing chamber and irradiation of Zn molecular beams and growing of the ZnCdSe low temperature buffer layer 104 (100 nm thickness) were conducted at a substrate temperature of 200° C. Then, at a substrate temperature of 300° C., the n-MgSe/Be$_{0.13}$Zn$_{0.87}$Se$_{0.38}$Te$_{0.62}$ (3 ML/3 ML) superlattice cladding layer 105 (800 nm thickness), the undoped MgSe/Be$_{0.13}$Zn$_{0.87}$Se$_{0.38}$Te$_{0.62}$ (1 ML/5 ML) superlattice optical guide layer 106 (20 nm thickness), the undoped MgSe/Be$_{0.13}$Zn$_{0.87}$Se$_{0.38}$Te$_{0.62}$ (1 ML/10 ML) multiple well active layer 107 (10 nm thickness), the undoped MgSe/Be$_{0.13}$Zn$_{0.87}$Se$_{0.38}$Te$_{0.62}$ (1 ML/5 ML) superlattice optical guide layer 108 (50 nm thickness), the p-MgSe/ZnSe$_{0.5}$Te$_{0.5}$/Be$_{0.13}$ Zn$_{0.87}$Se$_{0.38}$Te$_{0.62}$ (3 ML/1 ML/2 ML) superlattice cladding layer 109 (800 nm thickness), the Be$_{0.48}$Zn$_{0.52}$Te/ZnTe superlattice layer 110 (50 nm thickness), and the ZnTe cap layer 111 (5 nm thickness) were stacked successively. Growing was conducted while applying ZnCl$_2$ for n-doping and radical nitrogen doping for p-doping. In the growing of the MgSe/BeZnSeTe superlattice and the MgSe/ZnSeTe/BeZnSeTe superlattice, Zn irradiation was conducted for 4 sec before growing the respective layers of the superlattice. Then, the ZnTe cap layer was fabricated into a stripe shape of 10 μm width by bromine series wet etching. After forming the SiN insulative film by a plasma CVD process, a p-electrode connection portion of the SiN insulative film is removed. The p-electrode comprising Ni/Ti/Pt/Au was formed by electron-beam evaporation. A lift off method by a photoresist was used for the fabrication of the electrode shape. After alloying the p-electrode at 300° C., the InP substrate was polished to 100 μm and the n-electrode comprising AuGeNi was vapor deposited to the rear face. A laser structure of 1 mm device length was manufactured by cleaving. The semiconductor laser shown in FIGS. 14A, 14B oscillated at room temperature by driving with 200 mA DC current. The oscillation wavelength was 570 nm. Capability of continuous-wave oscillation at room temperature shows the effect of the invention.

Figure 15A:
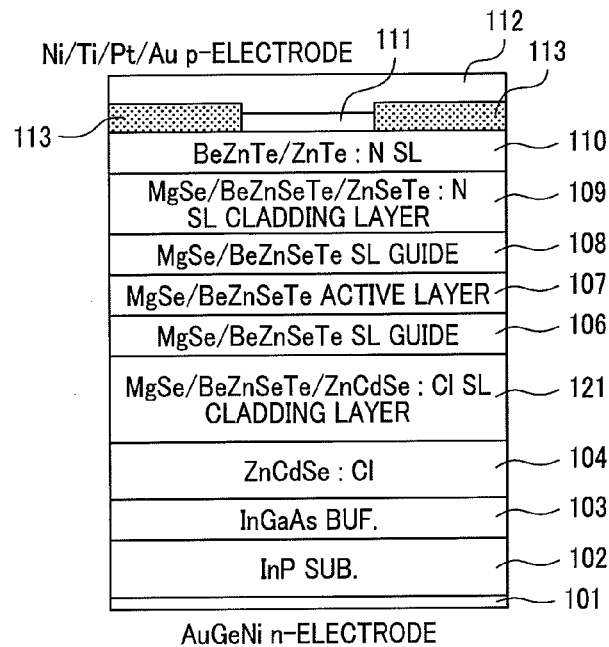
FIG. 15A is a schematic cross sectional view showing a semiconductor laser structure of a further example of present the invention.
Figure 15B:
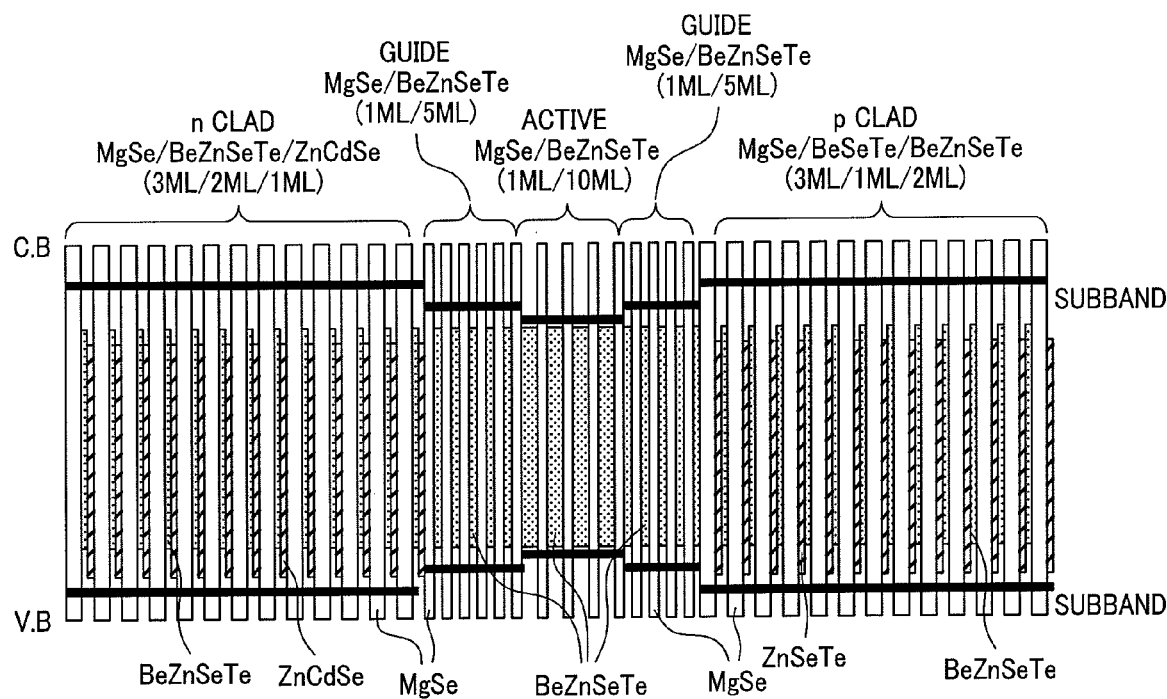
FIG. 15B is a view showing a band line-up of the semiconductor laser structure.

The example of FIGS. 15A, 15B is identical with the example shown in FIGS. 14A, 14B except for applying the MgSe/BeZnSeTe/ZnCdSe superlattice substantially lattice matched with InP for the lower cladding layer. FIG. 15A shows the structure of a semiconductor laser and FIG. 15B shows a band line-up.

In FIGS. 15A, 15B, reference numeral 101 denotes an n-electrode comprising AuGeNi; 102, an InP substrate; 103, an InGaAs buffer layer; 104, a Cl-doped ZnCdSe buffer layer; 121, a lower cladding layer comprising a Cl-coped MgSe/BeZnSeTe/ZnCdSe superlattice; 106, an n-side optical guide comprising an MgSe/BeZnSeTe superlattice layer; 107, an MgSe/BeZnSeTe active layer; 108, a p-side optical guide comprising an MgSe/BeZnSeTe superlattice layer; 109, an upper cladding layer comprising an N-doped MgSe/BeZnSeTe/ZnSeTe superlattice; 110, an N-doped BeZeTe/ZnTe superlattice layer; 111, an N-doped ZnTe cap layer; 112, a p-electrode comprising Ni/Ti/Pt/Au; and 113, an insulative layer. In this example, compared with the example shown in FIGS. 13A, 13B, MgSe/BeZnSeTe was used instead of BaZnSeTe for the active layer 107, the lower cladding layer 121 was formed of the Cl-doped MgSe/BeZnSeTe/ZnCdSe superlattice and the upper cladding layer 109 was formed of N-doped MgSe/BeZnSeTe/ZnSeTe superlattice.

Manufacturing procedures are shown below. At first, after applying an appropriate surface treatment to the InP substrates 102, it was set in an MBE apparatus. After placing it in a preparatory chamber for specimen exchange, it was evacuated by a vacuum pump to $10^{-3}$ Pa or lower, and heated up to 100° C. to dissociate residual water content and impurity gas. Then, it was conveyed to a group III-V exclusive growing chamber and heated to a substrate temperature of 500° C. while irradiating P molecular beams to the substrate surface to remove oxide films on the substrate surface. Then, the InGaAs buffer layer 103 was grown to 200 nm thickness at a substrate temperature of 470° C. Then, the sample was conveyed to a group II-VI exclusive growing chamber and irradiation of the Zn molecular beams and growing of ZnCdSe low temperature buffer layer 104 (100 nm thickness) were conducted at substrate temperature of 200° C. Then, at a substrate temperature of 300° C., the n-MgSe/Be$_{0.13}$Zn$_{0.87}$Se$_{0.38}$Te$_{0.62}$/Zn$_{0.48}$Cd$_{0.52}$Se (3 ML/2 ML/1 ML) superlattice cladding layer 121 (800 nm thickness), the undoped MgSe/Be$_{0.13}$Zn$_{0.87}$Se$_{0.38}$Te$_{0.62}$ (1 ML/5 ML) superlattice optical guide layer 106 (20 nm thickness), the undoped MgSe/Be$_{0.13}$Zn$_{0.87}$Se$_{0.38}$Te$_{0.62}$ (1 ML/10 ML) multiple well active layer 107 (10 nm thickness), the undoped MgSe/Be$_{0.13}$Zn$_{0.87}$Se$_{0.38}$Te$_{0.62}$ (1 ML/5ML) superlattice optical guide layer 108 (50 nm thickness), the p-MgSe/ZnSe$_{0.5}$Te$_{0.5}$/Be$_{0.13}$ Zn$_{0.87}$Se$_{0.38}$Te$_{0.62}$ (3 ML/1 ML/2 ML) superlattice cladding layer 109 (800 nm thickness), the Be$_{0.48}$Zn$_{0.52}$Te/ZnTe superlattice layer 110 (50 nm thickness), and the ZnTe cap layer 111 (5 nm thickness) were stacked successively. Growing was conducted while applying ZnCl$_2$ for n-doping and radical nitrogen doping for p-doping. In the growing of the MgSe/BeZnSeTe superlattice and the MgSe/ZnSeTe/BeZnSeTe and MgSe/ZnCdSe/BeZnSeTe superlattice, Zn irradiation was conducted for 4 sec before growing the respective layers of the superlattice. Then, the ZnTe cap layer was fabricated into a stripe shape of 10 μm width by bromine series wet etching. After forming the SiN insulative film by a plasma CVD process, a p-electrode connection portion of the SiN insulative film was removed. The p-electrode comprising Ni/Ti/Pt/Au was formed by electron-beam evaporation. A lift off method by a photoresist was used for the fabrication of the electrode shape. After alloying the p-electrode at 300° C., the InP substrate was polished to 100 μm and the n-electrode comprising AuGeNi was vapor deposited to the rear face. A laser structure of 1 mm device length was manufactured by cleaving. The semiconductor laser shown in FIGS. 15A, 15B oscillated at a room temperature by driving with 200 mA DC current. The oscillation wavelength was 570 nm. The capability of the continuous-wave oscillation at a room temperature shows the effect of the invention.

Further, while the three examples of using the superlattice structure have been shown, they can be combined. Further, instead of the superlattice structure of the examples, a constitution of using bulk crystals such as MgZnSeTe or, MgCdZnSe to a portion of the optical guide layer or the cladding layer, or combination thereof is also possible.

Further, in the three examples, the active layer comprises the Be-containing group II-VI compound semiconductor mixed crystal layer. One of the first optical guide layer, the second optical guide layer, the n-cladding layer and the p-cladding layer has a layer comprising the same matrix element as that in the Be-containing group II-VI compound semiconductor mixed crystal layer of the active layer. That is, while they show a case of using the first optical guide layer and the second optical guide layer, and a case of using the n-cladding layer, the first optical guide layer, the second optical guide layer, and the p-cladding layer, there may be eight combinations as described below. The examples correspond to the following combinations (3) and (8). Considering the principles of the invention, that is, high reliability due to Be addition,
prevention of type II junction and optical confinement by the application of the same material as that for the active layer to other layers,
improvement in the crystallinity by lattice matching and Zn irradiation, it is apparent that the invention has the improved effect relative to the existent structure also in the structures (1) to (8).

(1) The first optical guide layer,
(2) the second optical guide layer,
(3) the first optical guide layer, and the second optical guide layer,
(4) the n-cladding layer and the first optical guide layer,
(5) the second optical guide layer and p-cladding layer,
(6) the n-cladding layer, the first optical guide layer, and the second optical guide layer,
(7) the first optical guide layer, the second optical guide layer, and the p-cladding layer, and
(8) the n-cladding layer, the first optical guide layer, the second optical guide layer, and the p-cladding layer.

DESCRIPTION OF REFERENCES 1, 21 n-electrode comprising Au—Ge
2, 22 InP substrate,
3, 23 InGaAs buffer layer,
4, 24 Cl-doped ZnCdSe buffer layer,
5, 25 lower cladding layer comprising a Cl-doped, MgSe/ZnCdSe superlattice,
6, 26 thick stepped superlattice layer comprising a MgSe/ZnCdSe superlattice,
7, 28 BeZnSeTe active layer,
8 MgSe/ZnCdSe superlattice layer,
9 upper cladding layer comprising N-doped MgSe/BeZnTe superlattice,
10, 31 N-doped BeZnTe/ZnTe superlattice layer,
11, 32 N-doped ZnTe cap layer,
12, 33 p-electrode comprising Au,
13, 34 insulative layer,
27 n-side optical guide comprising a MgSe/BeZnSeTe superlattice layer,
29 p-side optical guide comprising a MgSe/BeZnSeTe superlattice layer,
30 upper cladding layer comprising an N-doped MgSe/BeZnTe superlattice,
41, 51 InP substrate,
42, 52 InP buffer layer
43, 53 InGaAs buffer layer,
44, 54 ZnCdSe buffer layer,
45 BeZnSeTe layer,
46, 56 ZnTe cap layer,
55 MgSe/BeZnSeTe superlattice layer,
61, 71 InP substrate,
62, 72 InP buffer layer,
63, 73 InGaAs buffer layer,
64, 74 ZnCdSe buffer layer,
65 Cl-doped MgSe/BeZnSeTe superlattice layer,
66, 76 Al/Ti Schottky type electrode,
75 N-doped MgSe/ZnSeTe/BeZnSeTe superlattice layer,
81, 101 n-electrode comprising AuGeNi,
82, 102 InP substrate,
83, 103 InGaAs buffer layer,
84, 104 Cl-doped ZnCdSe buffer layer,
85, lower cladding layer comprising a Cl-doped MgSe/ZnCdSe superlattice,
86 thick stepped superlattice layer comprising a MgSe/ZnCdSe superlattice,
87 n-side optical guide comprising a MgSe/BeZnSeTe superlattice layer,
88 BeZnSeTe active layer,
89 p-side optical guide comprising a MgSe/BeZnSeTe superlattice layer,
90 upper cladding layer comprising an N-doped MgSe/BeZnTe superlattice,
91, 110 N-doped BeZnTe/ZnTe superlattice layer,
92, 111 N-doped ZnTe cap layer,
93, 112 p-electrode comprising an Ni/Ti/Pt/Au,
94, 113 insulative layer,
106 n-side optical guide comprising a MgSe/BeZnSeTe superlattice layer,
107 MgSe/BeZnSeTe active layer,
108 p-side optical guide comprising a MgSe/BeZnSeTe superlattice layer,
109 upper cladding layer comprising an N-doped MgSe/ZnSeTe/BeZnSeTe superlattice,
121 lower cladding layer comprising a Cl-doped MgSe/BeznSeTe/ZnCdSe superlattice.

What is claimed is:

1. A semiconductor laser having an n-cladding layer, a first optical guide layer, an active layer, a second optical guide layer, and a p-cladding layer above an InP substrate, wherein
the active layer has a Be-containing group II-VI compound semiconductor mixed crystal layer,
having a layer constituted with a matrix element identical with that of the Be-containing group II-VI compound semiconductor of the active layer in any one of the following layer configurations (1) to (8):
(1) the first optical guide layer,
(2) the second optical guide layer,
(3) the first optical guide layer, and the second optical guide layer,
(4) the n-cladding layer and the first optical guide layer,
(5) the second optical guide layer and p-cladding layer,
(6) the n-cladding layer, the first optical guide layer, and the second optical guide layer,
(7) the first optical guide layer, the second optical guide layer, and the p-cladding layer,
(8) the n-cladding layer, the first optical guide layer, the second optical guide layer, and the p-cladding layer; and a compositional ratio Xa of Be to the layer having Be of the layer configurations (1) to (8) and a compositional ratio Xb of Be to the layer having Be of the active layer satisfy a relation:

$$0.7 \times Xb < Xa < 1.3 \times Xb.$$

2. A semiconductor laser according to claim 1, wherein the active layer is constituted with $Be_{x1}Zn_{1-x1}Se_{y1}Te_{1-y1}$ mixed crystals, or constituted with a stacked structure of the $Be_{x1}Zn_{1-x1}Se_{y1}Te_{1-y1}$ mixed crystal layer and another crystal layer; and at least one of the optical guide layer, the p-cladding layer, and the n-cladding layer is formed of a superlattice structure of a $Be_{x2}Zn_{1-x2}Se_{y2}Te_{1-y2}$ mixed crystal well layer and a barrier layer constituted with other crystals, where a relation: $0.7 \times X1 < X2 < 1.3 \times X1$ and $0.7 \times Y1 < Y2 < 1.3 \times Y1$ is satisfied.

3. A semiconductor laser according to claim 1, wherein the active layer is constituted with $Be_{x1}Zn_{1-x1}Se_{y1}Te_{1-y1}$ mixed crystals, or constituted of a stacked structure of the $Be_{x1}Zn_{1-x1}Se_{y1}Te_{1-y1}$ mixed crystal layer and another crystal layer containing MgSe; and at least one of layers of the optical guide layer, the p-cladding layer, and the n-cladding layer is formed of a superlattice structure comprising $Be_{x2}Zn_{1-x2}Se_{y2}Te_{1-y2}$ mixed crystals as a well layer and MgSe crystals as a barrier layer, where a relation: $0.7 \times X1 < X2 < 1.3 \times X1$ and $0.7 \times Y1 < Y2 < 1.3 \times Y1$ is satisfied.

4. A semiconductor laser according to claim 2, wherein the $Be_{x1}Zn_{1-x1}Se_{y1}Te_{1-y1}$ mixed crystals constituting the active layer are lattice matched with the InP substrate at a lattice mismatching degree within 1%, where a relation: $0.01 < X1 < 0.3$ is satisfied.

5. A semiconductor laser according to claim 3, wherein the $Be_{x1}Zn_{1-x1}Se_{y1}Te_{1-y1}$ mixed crystals constituting the active layer are lattice matched with the InP substrate with a lattice mismatching degree of 1% or less, where a relation: $0.01 < X1 < 0.3$ is satisfied.

* * * * *